US007005869B2

(12) United States Patent
Saulnier et al.

(10) Patent No.: US 7,005,869 B2
(45) Date of Patent: *Feb. 28, 2006

(54) MULTI POINT CONTACTOR AND BLADE CONSTRUCTION

(75) Inventors: Christian R. Saulnier, Boutigny (FR); James G. Gasque, Vista, CA (US); Manuel A. Gallardo, Thorigny/Marne (FR)

(73) Assignee: Ceramic Component Technologies, Inc., Vista, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/877,418

(22) Filed: Jun. 25, 2004

(65) Prior Publication Data

US 2004/0232929 A1 Nov. 25, 2004

Related U.S. Application Data

(63) Continuation-in-part of application No. 10/097,464, filed on Mar. 14, 2002, now Pat. No. 6,756,798.

(51) Int. Cl.
*G01R 31/02* (2006.01)
(52) U.S. Cl. .................................................. 324/754
(58) Field of Classification Search .................. None
See application file for complete search history.

(56) References Cited

U.S. PATENT DOCUMENTS 3,812,311 A * 5/1974 Kvaternik ................ 200/61.42
6,756,798 B1 * 6/2004 Saulnier et al. ............. 324/754

* cited by examiner

*Primary Examiner*—Vinh Nguyen
*Assistant Examiner*—Trung Q Nguyen
(74) *Attorney, Agent, or Firm*—Loyal McKinley Hanson

(57) ABSTRACT

A multi point contactor (MPC) on a component testing system for electrically contacting a terminal on a device under test (DUT) includes at least three independently moveable contacts to help insure at least two of them contact the DUT terminal. At least one of the contacts includes an integral spring, preferably in the form of a blade laser machined from a sheet of electrically conductive material to include a first portion for bearing against the contact-holding structure, a second portion for bearing against the terminal on the DUT, and a third portion interconnecting the first and second portions that functions as an integral spring bias for spring biasing the second portion from the first portion toward the terminal on the DUT. Preferably, the third portion of the blade has a serpentine shape that consistently results in desired constant-force spring characteristics over a nominal range of blade travel.

8 Claims, 19 Drawing Sheets

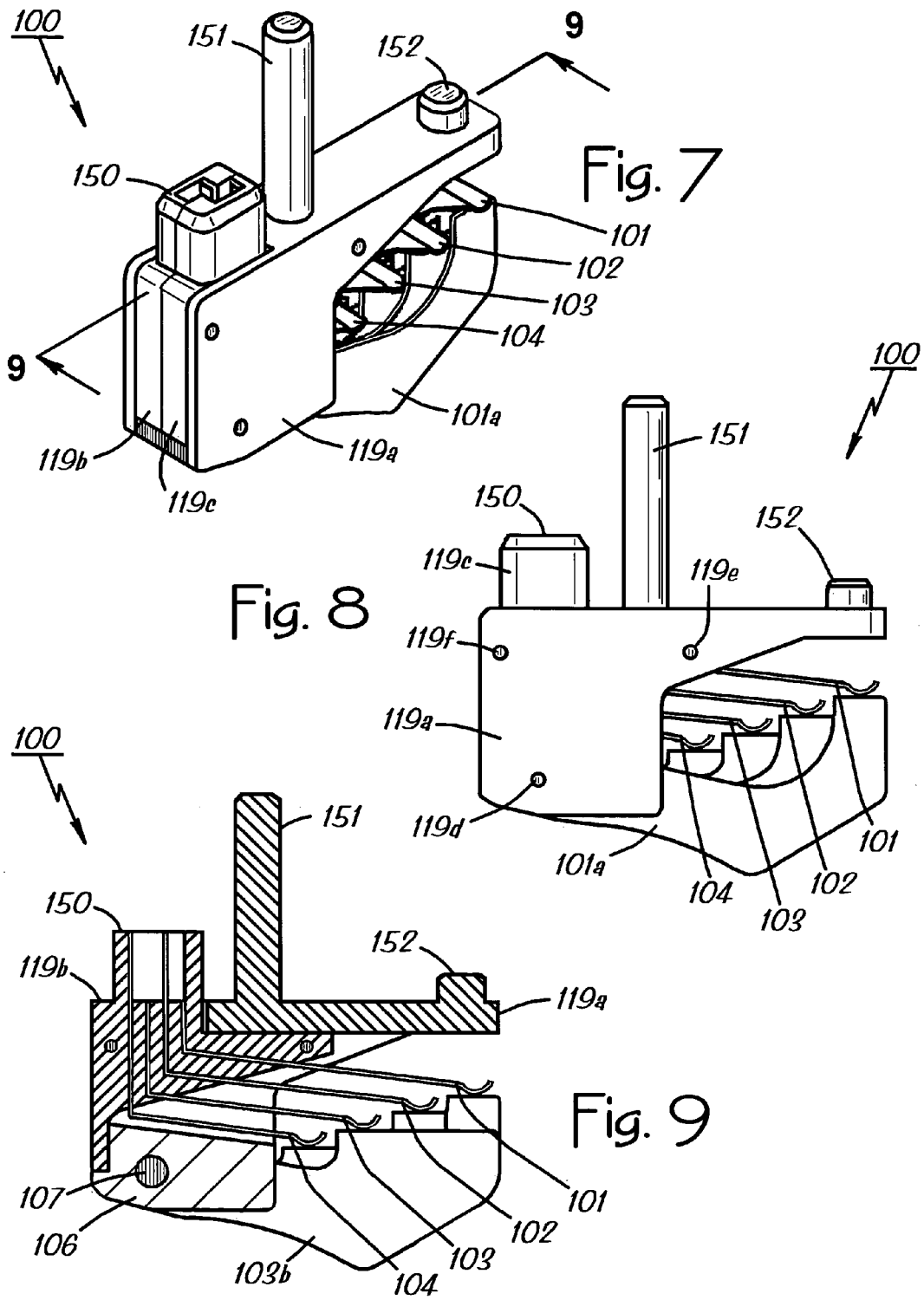

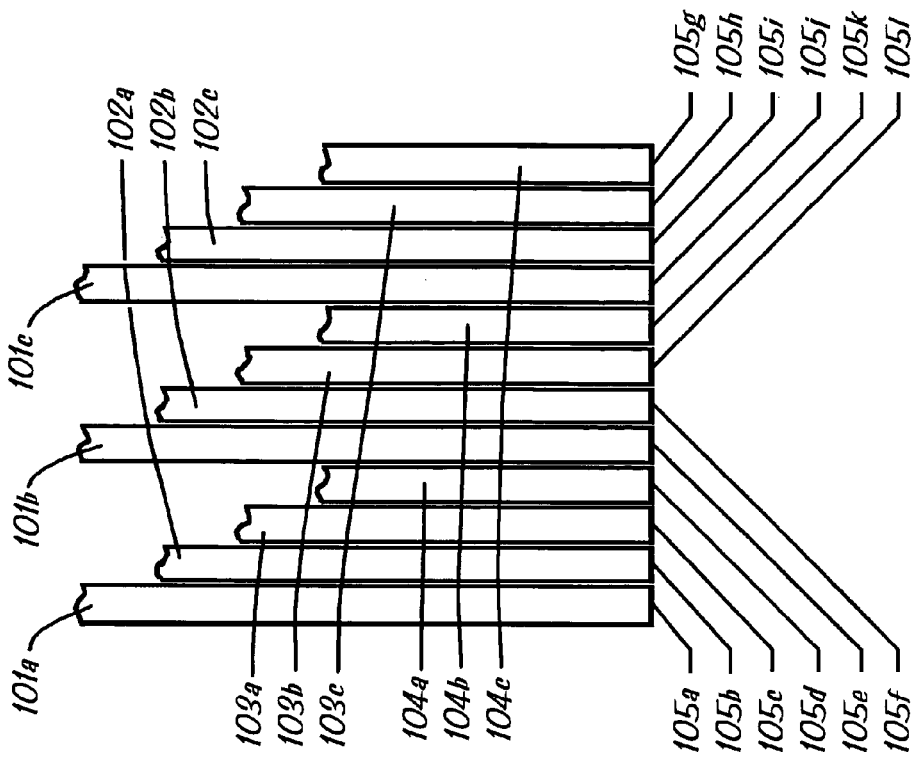
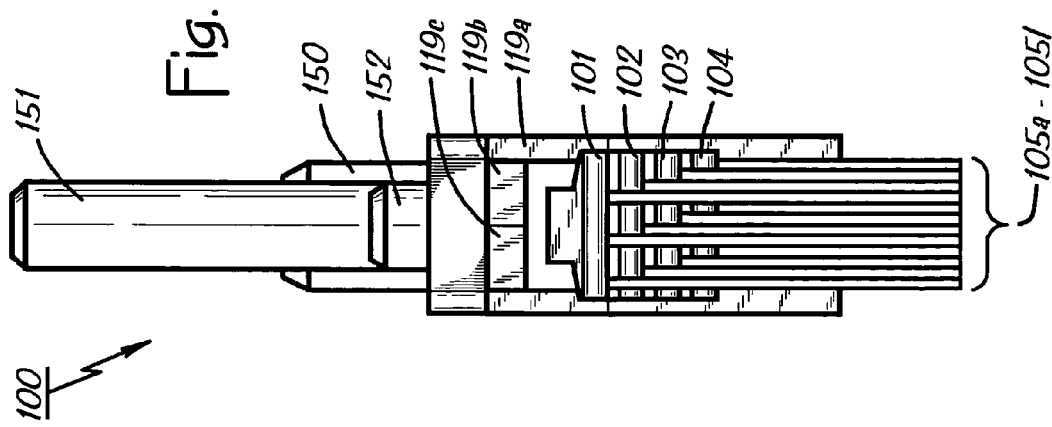

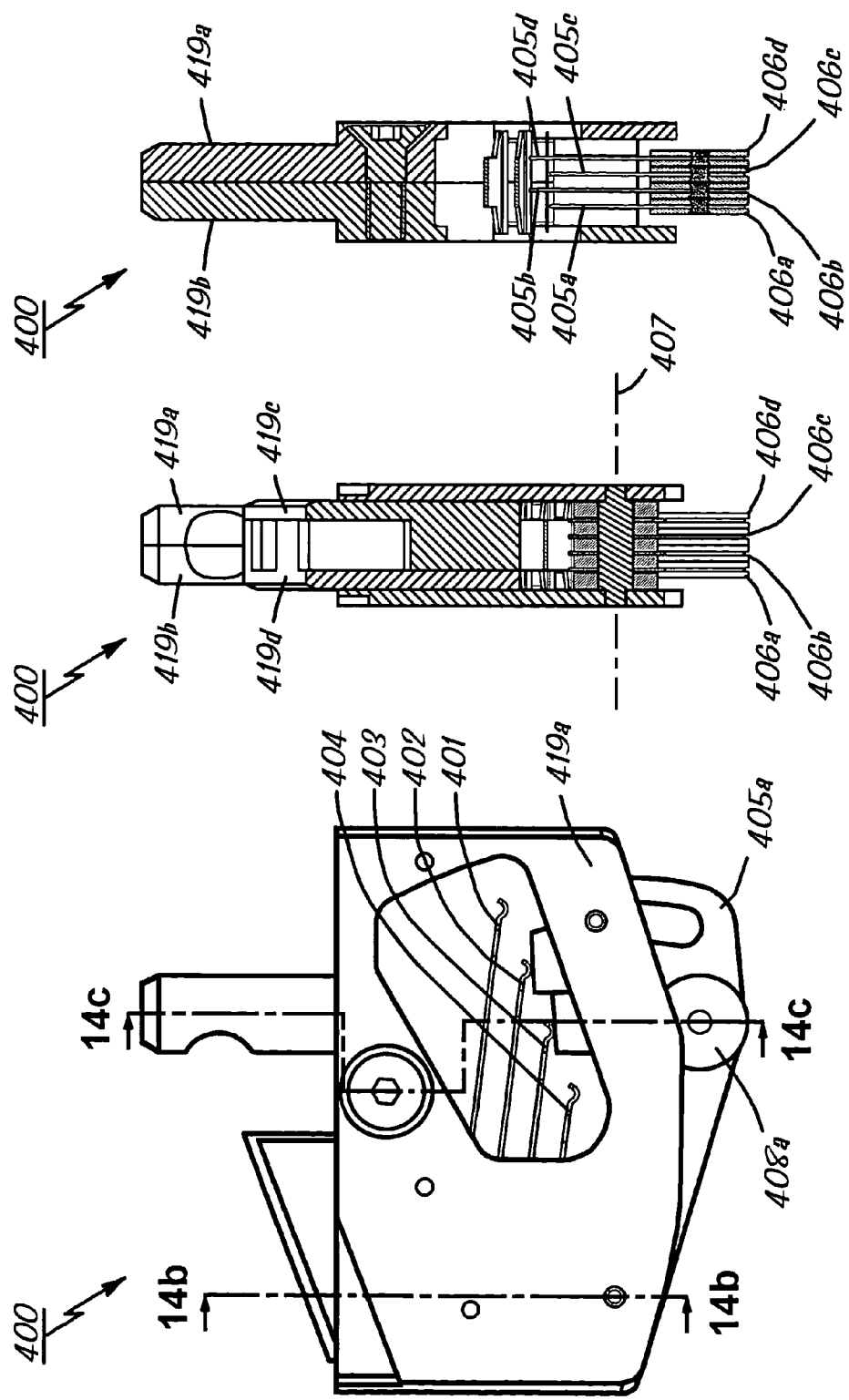

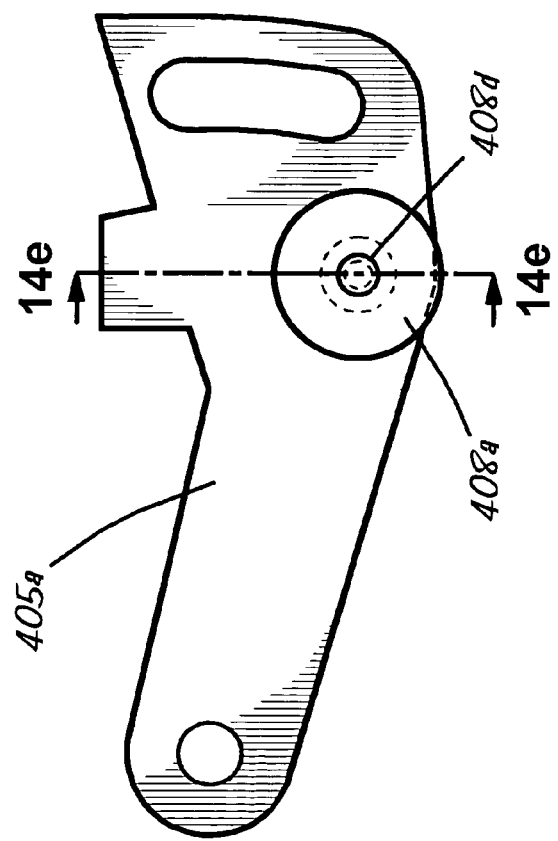
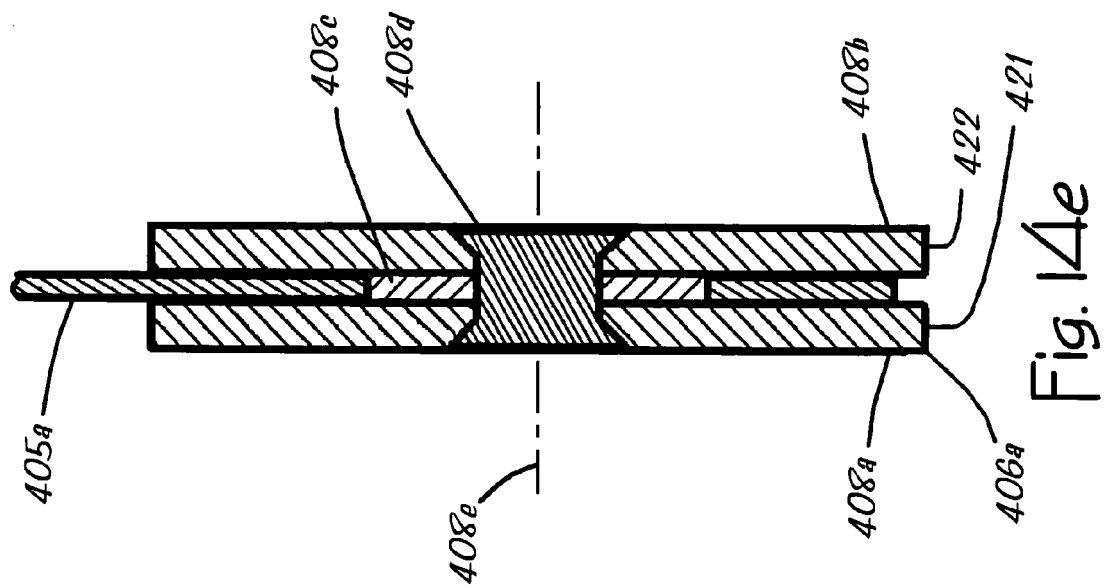
Fig. 14d
Fig. 14e

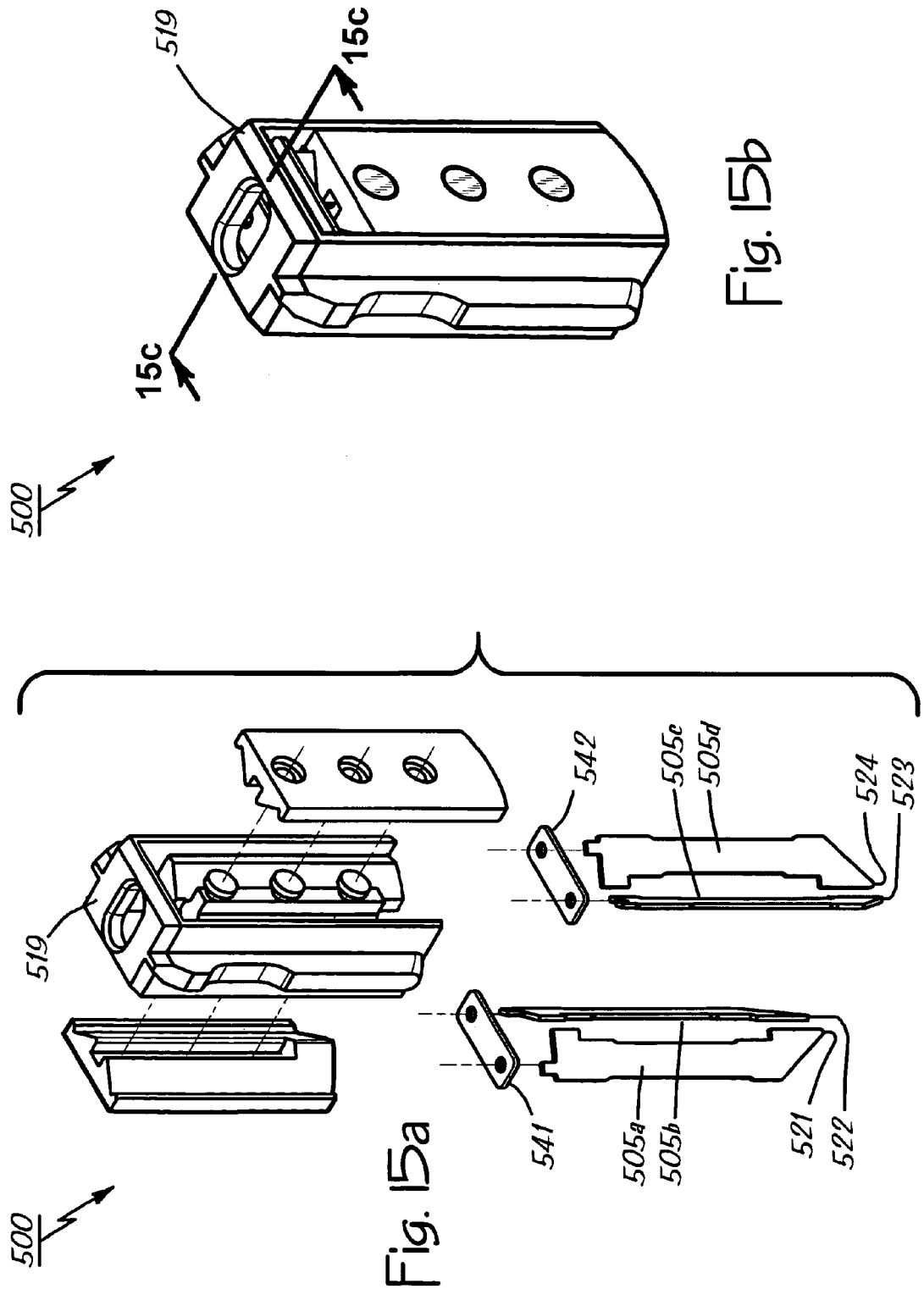

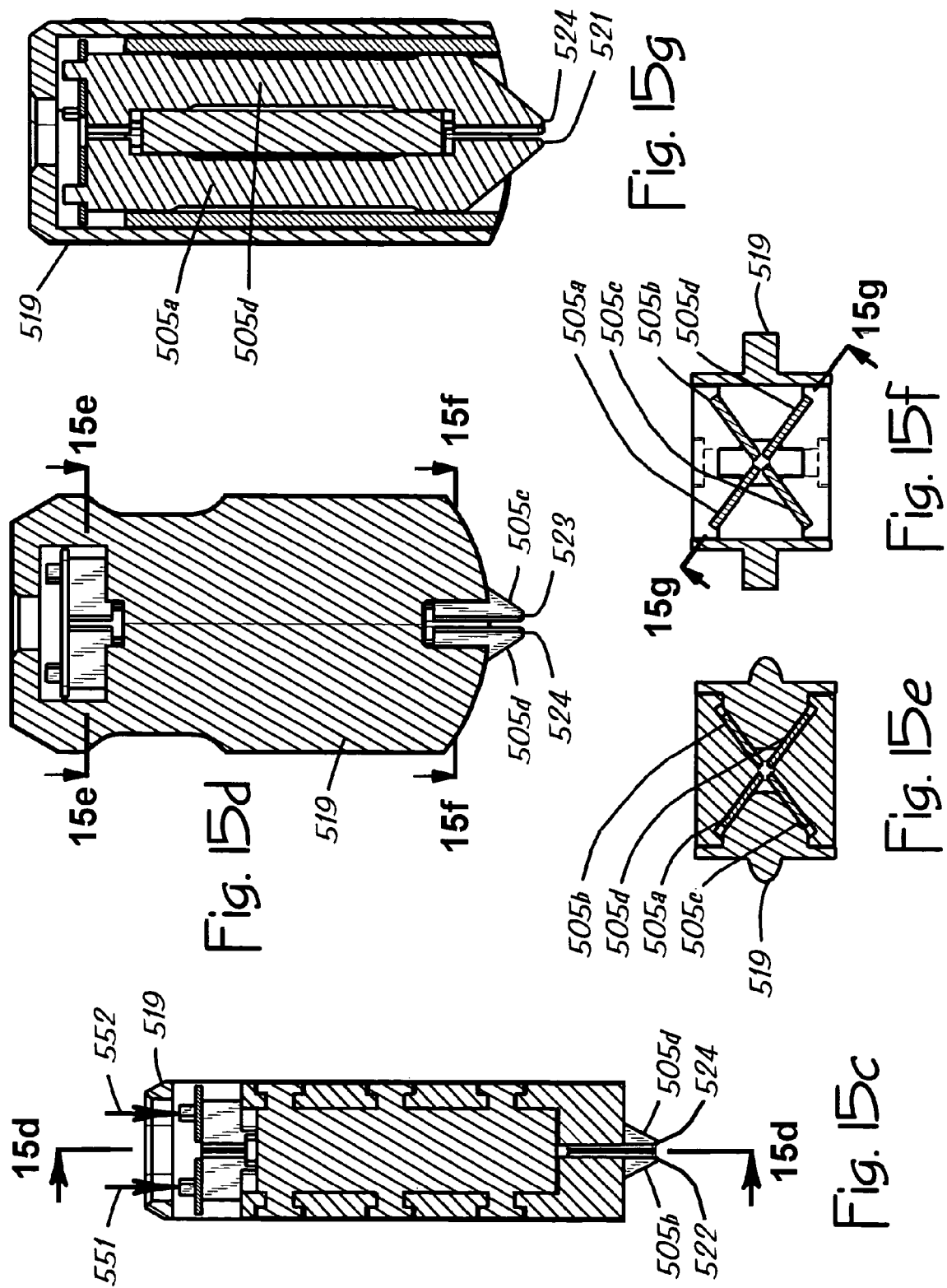

MULTI POINT CONTACTOR AND BLADE CONSTRUCTION

CROSS REFERENCE TO RELATED APPLICATION

This application is a continuation in part of and commonly assigned U.S. patent application Ser. No. 10/097,464 filed Mar. 14, 2002, now U.S. Pat. No. 6,756,798.

BACKGROUND OF THE INVENTION

1. Technical Field

This invention relates generally to the batch processing of miniature electronic circuit components, including passive, two-terminal, ceramic capacitors, resistors, inductors, and the like. More particularly, it concerns a contactor assembly for electrically contacting a terminal on such a component or other device under test (DUT) as part of the batch processing for purposes of parametric testing.

2. Description of Related Art

The tiny size of electronic circuit components of interest herein complicates processing. Typically fabricated in parallelepiped shapes having dimensions as small as 0.020" by 0.010" by 0.010," more or less, these difficult-to-handle components require appropriate equipment and precision handling techniques. What is sometimes referred to as a "carrier plate" holds many hundreds of the components upright in spaced-apart positions as the ends of each component are coated with a conductive material to produce electrical terminals. After adding terminals, a "test plate" holds the large batch of components for movement past a contactor assembly of a testing system for parametric testing purposes and eventual sorting. Thoughtful design of each of these components promotes efficient processing. Reference may be made to U.S. Pat. Nos. 6,204,464; 6,294,747; 6,194,679; 6,069,480; 4,395,184; and 4,669,416 for examples of some prior art component handling systems and testing techniques.

The contactor assembly is of particular interest. It is a device having an electrical contact (an electrically conductive member) that touches the DUT terminal as the test plate moves the DUT past the contactor assembly. It does so to complete an electrical testing circuit. One problem is that touching the DUT terminal improperly can physically damage the terminal. It can also produce a poor electrical contact that degrades test results.

Existing production testers often use "sliding contacts," "rolling contacts," and/or "pogo pin contacts" to perform the electrical and mechanical functions. Electrically, the contacts should couple a test signal between testing components and the DUT terminal in a manner providing a sufficiently accurate electrical test. Mechanically, the contacts should press the contact against the DUT terminal with enough force to attain a good electrical contact despite the usual presence of a non-conductive oxide layer on the surface of the DUT terminal. Sufficient force causes the contact (e.g., a sliding leaf spring type of contact) to advance through the oxide layer to the underlying conductive material of the DUT terminal, and that reduces electrical resistance between the contact and the DUT terminal.

One problem is that forcing the contact against the DUT terminal can leave a mark or scratch on the surface of the DUT terminal. End users of the component often consider such scratches to be defects. Failure to achieve a good electrical contact, on the other hand, degrades test results. The electrical and mechanical functions are conflicting in those respects and existing contactor assembly designs exhibit varying degrees of success in alleviating the conflict. Thus, manufacturers engaged in batch processing of miniature electronic circuit components seek improvement in contactor assembly design and so a need exists for a better contactor assembly.

U.S. patent application Ser. No. 10/097,464 filed Mar. 14, 2002 and issued as U.S. Pat. No. 6,756,798 addresses the concerns outlined above. It describes a contactor assembly having at least three independently moveable contacts in side-by-side relationship that are spring biased toward the DUT terminal. Such a contactor assembly is sometimes referred to as a multi point contactor (MPC). Three independently moveable contacts help insure that at least two of the contacts make electrical contact with the DUT terminal for lower serial impedance in series with the effective serial resistance (ESR) of the DUT. Preferably, spring biasing results in a constant-force over a normal range of travel (e.g., one to three millimeters) so that one contact does not dominate and hinder electrical contact by the others. Thus, a constant, predictable force is important to proper functioning, and so further MPC technology refinements are desirable in that respect.

This invention addresses the need outlined above by providing an MPC assembly and contact or blade construction having an integral spring that is formed as a part of the blade (e.g., laser machined or chemically etched). The blade is laser machined from a sheet of electrically conductive material to include the integral spring. Fabrication is precise, repeatable, and conveniently varied for different spring characteristics. In operation, the blade is spring biased toward the DUT independent of the other blades, but with a uniform force over a nominal range of travel that is common to all the blades.

To paraphrase some of the more precise language appearing in the claims and further introduce the nomenclature use, a contactor assembly constructed according to the invention includes a contact-holding structure that holds at least contacts three contacts (also referred to as blades). At least one of the contacts includes an integral spring (i.e., a spring portion of the contact). Preferably, that contact is in the form of a blade fabricated from a sheet of electrically conductive material to include a first portion for bearing against the contact-holding structure (directly or indirectly via an external spring), a second portion for bearing against the terminal on the DUT, and a third portion interconnecting the first and second portions. The third portion is shaped and dimensioned (i.e., adapted) to function as an integral spring for spring biasing the second portion away from the first portion toward the terminal on the DUT. Preferably, the third portion of the blade has a serpentine shape blade that achieves desired constant-force spring characteristics over a nominal range of blade travel.

In line with the above, a method for fabricating blades for a component testing system contactor assembly includes the step of providing a sheet of electrically conductive material. The method proceeds by forming an array of blades in the sheet of electrically conductive material (e.g., by laser-machining or chemical etching the sheet) such that each blade includes (i) a first portion for bearing against the contact-holding structure, (ii) a second portion for bearing against the terminal on the DUT, and (iii) a third portion interconnecting the first and second portions as an integral spring having desired spring characteristics. The array of blades is then separated into individual blades. The size and shape fabricated may be adjusted empirically or theoretically to result in different spring characteristics.

Thus, the invention significantly improves MPC technology with a constant-force, integral-spring, MPC blade construction. The MPC assembly can have many blades, each with its own integral spring so that all blades can contact the surface of the DUT. Very low force is achieved. It is a constant force. By using thin blades with no external springs, with the blades spaced as desired by identically shaped insulating spacers, there is virtually no limit to the number of electrical contacts that can be made to the DUT terminal. The following illustrative drawings and detailed description make the foregoing and other objects, features, and advantages of the invention more apparent.

BRIEF DESCRIPTION OF THE DRAWINGS

FIG. 7 is an isometric view of a four-spring, twelve-blade, second embodiment of a contactor assembly constructed according to the invention;

FIG. 8 is a side elevation view of the second embodiment;

FIG. 9 is a cross sectional view of the second embodiment as viewed in a vertical plane containing a line 9—9 in FIG. 7;

FIG. 10 is an enlarged front elevation view of the second embodiment;

FIG. 11 is a further enlarged front elevation view of the second embodiment showing a portion of the twelve blades;

FIG. 14a is a side elevation view of a roller-type fifth embodiment of a contactor assembly constructed according to the invention;

FIG. 14b is a cross sectional view of the roller-type fifth embodiment as viewed in a vertical plane containing a line 14b—14b in FIG. 14a;

FIG. 14c is a cross sectional view of the roller-type fifth embodiment as viewed in vertical planes containing a segmented line 14c—14c in FIG. 14a;

FIG. 14d is an enlarged side elevation view of a contact blade and roller assembly of the roller-type fifth embodiment;

FIG. 14e is a further enlarged cross sectional view of the roller assembly as viewed in a vertical plane containing a line 14e—14e in FIG. 14d;

FIG. 15a is an exploded view of a pogo-pin sixth embodiment of a contactor assembly constructed according to the invention;

FIG. 15b is an isometric view of the pogo-pin sixth embodiment;

FIG. 15c is a cross sectional view of the pogo-pin sixth embodiment as viewed in a vertical plane containing a line 15c—15c in FIG. 15b;

FIG. 15d is a cross sectional view of the pogo-pin sixth embodiment as viewed in a vertical plane containing a line 15d—15d in FIG. 15c;

FIG. 15e is a cross sectional view of the pogo-pin sixth embodiment as viewed in a horizontal plane containing a line 15e—15e in FIG. 15d;

FIG. 15f is a cross sectional view of the pogo-pin-type sixth embodiment as viewed in a horizontal plane containing a line 15f—15f in FIG. 15d;

FIG. 15g is a cross sectional view of the pogo-pin type sixth embodiment as viewed in a vertical plane containing a line 15g—15g in FIG. 15f;

DESCRIPTION OF THE PREFERRED EMBODIMENTS

The description of the preferred embodiments begins with an MPC Technology section of this specification that restates some information presented in U.S. patent application Ser. No. 10/097,464 filed Mar. 14, 2002 (now U.S. Pat. No. 6,756,798). Thereafter, additional information is presented on blade construction in a Blade Construction section. A reader already familiar with the specification and FIGS. 1–15 of the above-identified patent application, may proceed directly to the additional information in the Blade Construction section.

MPC Technology. FIGS. 1–4 of the drawings show various aspects of a contactor assembly 10 constructed according to the invention to have three or more contacts in order to insure that at least two of them contact a terminal on a device under test (DUT). The contactor assembly 10 includes eight contacts. They are sliding contacts in the form of narrow, electrically conductive blades 11–18 (e.g., metal) held by a contact-holding structure 19 (e.g., nonconductive plastic). All eight of the blades 11–18 are designated in FIGS. 3 and 4, while just two of the eight blade contacts are designated in FIG. 1 and two in FIG. 2. Although the illustrated contact-holding structure 19 is composed of an electrically nonconductive material, it may be composed of an electrically conductive material within the broader inventive concepts disclosed and it is intended that the drawings cover that alternative also. When composed of an electrically conductive material, it may be held at a guard potential or a ground potential, for example.

Figure 1:
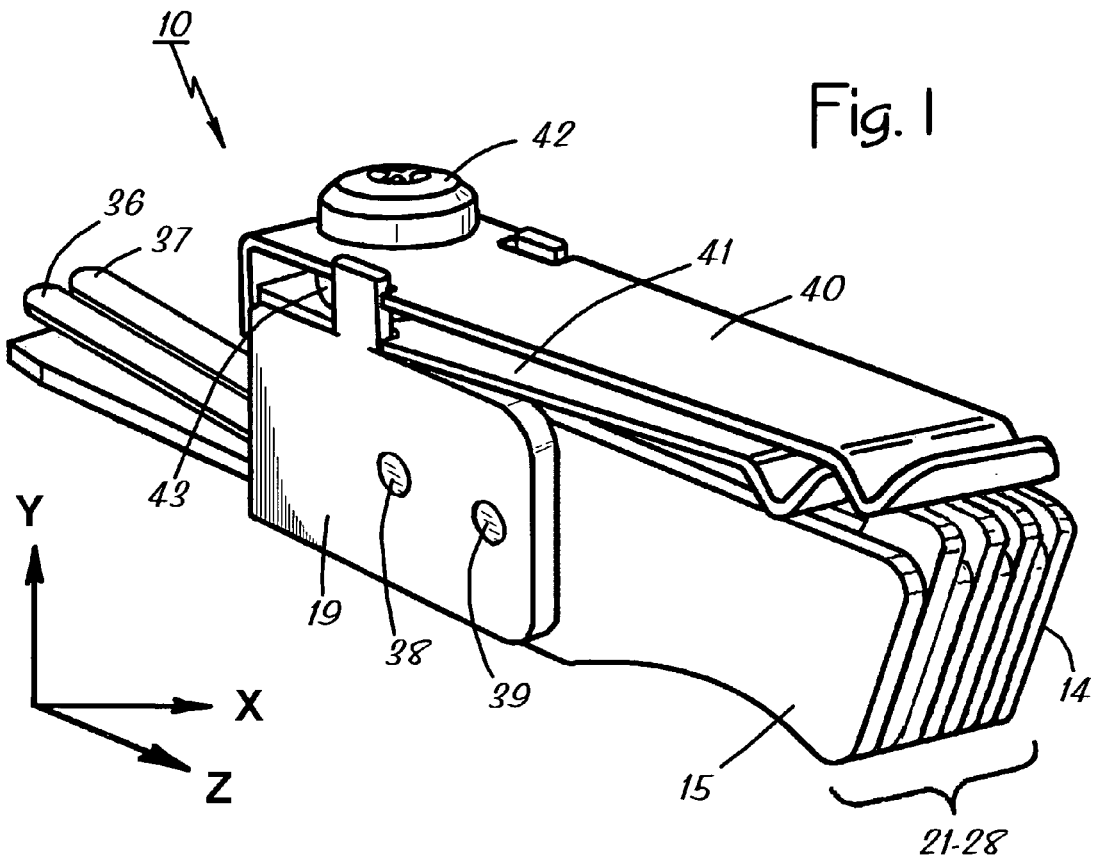
FIG. 1 of the drawings is an isometric view of a two-spring, eight-blade, first embodiment of a multi-contact, constant-force contactor assembly constructed according to the invention, with an X-Y-Z Cartesian coordinated system illustrated for use in describing the contactor assembly.
Figure 2:
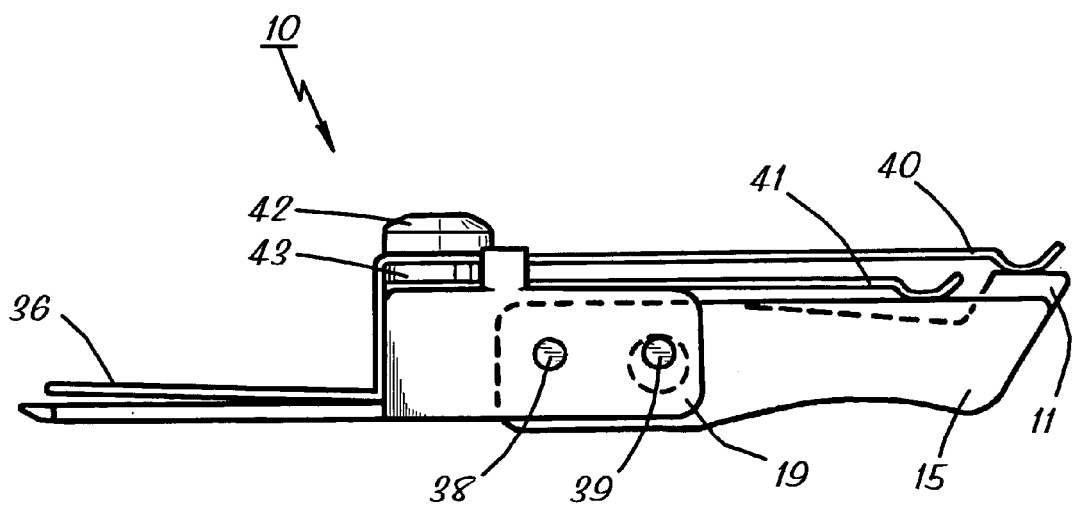
FIG. 2 is a side elevation view of the first embodiment.
Figure 3:
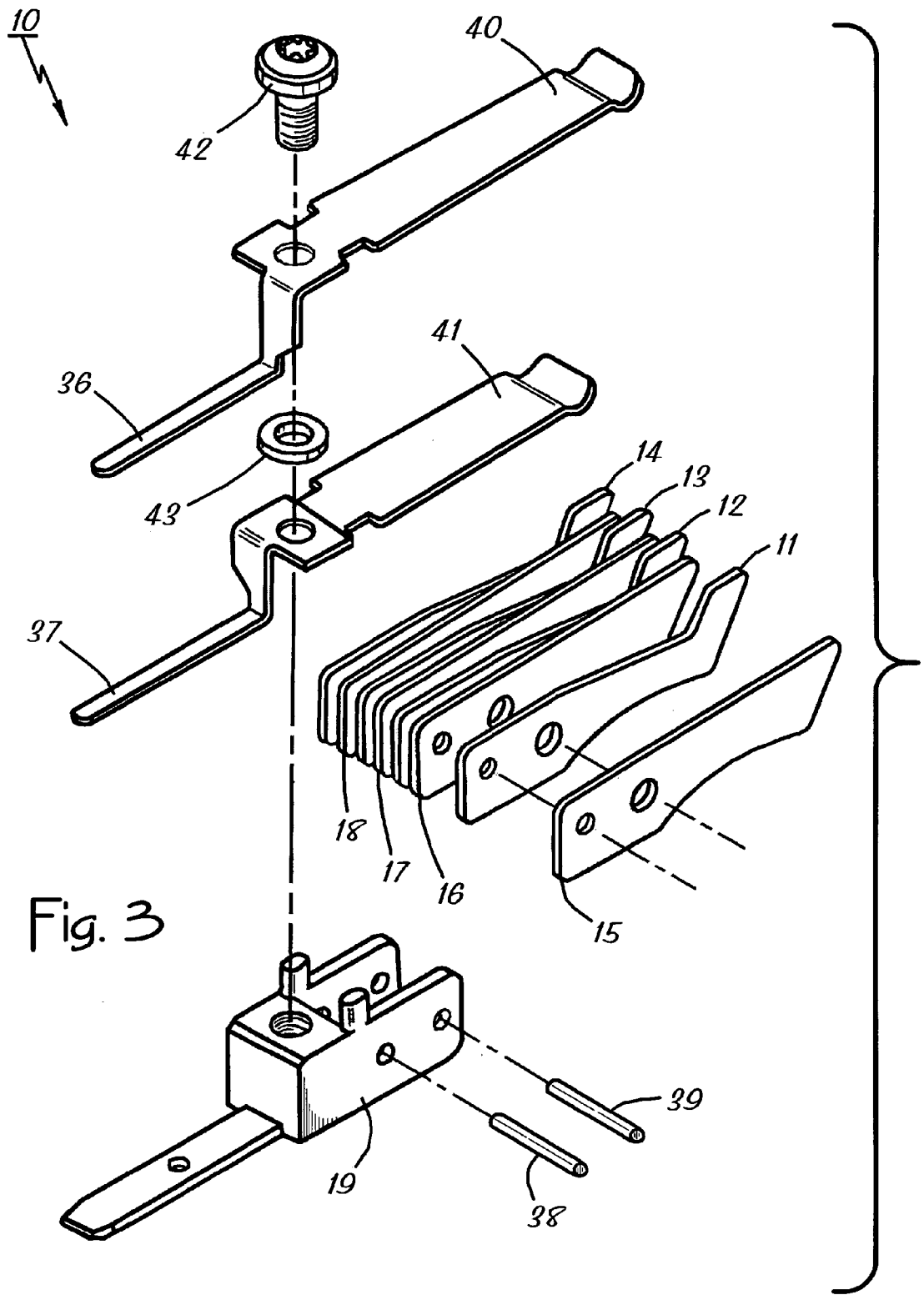
FIG. 3 is an exploded view of the first embodiment.
Figure 4:
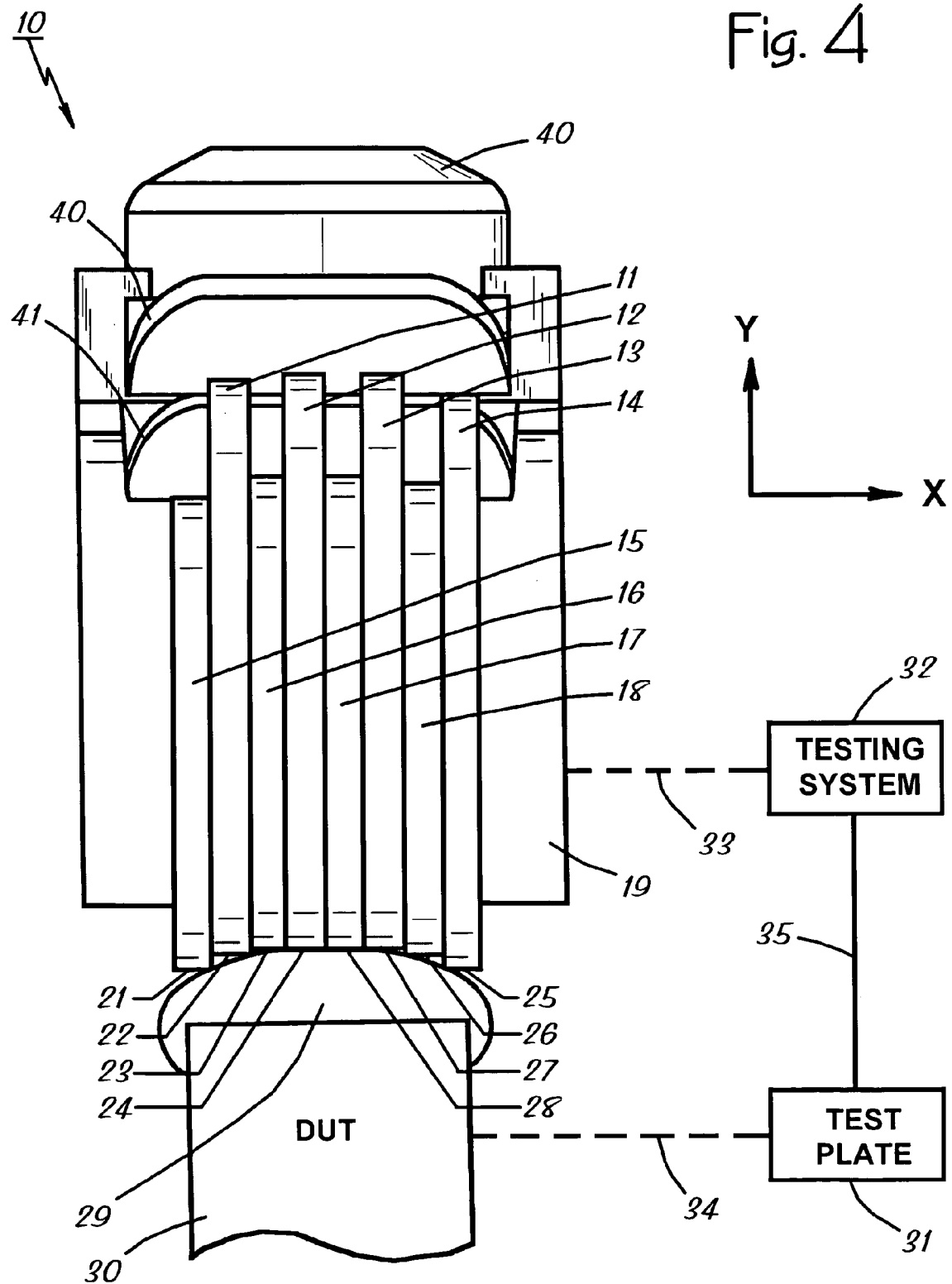
FIG. 4 is an enlarged front elevation view of the first embodiment showing the testing system, test plate, and DUT diagrammatically with the contact blades contacting the terminal on the DUT.

Each of the blades 11–18 has a respective one of forward edges 21–28 (designated in FIGS. 1 and 4). The forward edges 21–28 serve to physically and electrically contact a terminal 29 on a DUT 30 as illustrated in FIG. 4. That occurs when a test plate component 31 of a testing system 32 (shown diagrammatically in FIG. 4) moves the DUT 30 past the contactor assembly 10. The dashed line 33 in FIG. 4 diagrammatically indicates physical and electrical connection of the contactor assembly 10 to the testing system 32, while the dashed line 34 indicates physical holding and movement of the DUT 30 past the contactor assembly 10 by the test plate 31 in a known way, and the solid line 35 indicates that the test plate 31 is part of the testing system 32. The contact-holding structure 19 mounts on the testing system 32 as means for supporting the blades 11–18 on the component testing system 32 while first and second terminals 36 and 37 (FIGS. 1–3) electrically connect the blades 11–18 to the testing system 32.

The eight blades 11–18 include four larger blades 11–14 interleaved in close side-by-side relationship with four smaller blades 15–18 as illustrated. They are held in that relationship by the blade-holding structure 19 and pins 38 and 39 That arrangement results in an overall width of the blades 11–18 (measured parallel to the X axis) comparable to the width of the terminal 29 (e.g., 1.0 to 5.0 millimeters overall blade width for a DUT terminal width of that size), and that helps insure multiple contact of the terminal 29 during testing by the forward edges of at least two blades. In addition, the blades 11–18 are supported moveably on the contact-holding structure 19 in side-by-side relationship for independent movement toward and away from the terminal 29 on the DUT 30 as the DUT 30 moves past the contactor assembly 10 (e.g., they pivot slightly about the pin 38). The blades 11–18 move independently parallel to the Y axis and that helps them conform to the shape of the terminal 31. They typically travel about one to three millimeters in the Y direction to accommodate the variations in shape of a typical DUT terminal and that amount is referred to herein as a normal or nominal range of travel (i.e., the arc through which they pivot).

The contactor assembly 10 includes first and second leaf springs 40 and 41 held in insulated relationship on the contact-support structure 19 with a nonconductive screw 42 (e.g., plastic) and a nonconductive washer 43. The first and second springs 40 and 41 serve as means for spring biasing the forward edges 21–28 toward the DUT terminal 29. The first spring 40 bears against the larger blades 11–14 and thereby spring biases the forward edges 22, 24, 26, and 28 of the larger blades 11–14 toward the DUT terminal 29 independent of the forward edges 21, 23, 25, and 27. Similarly, the second spring bears the smaller blades 15–18 and thereby spring biases the forward edges 21, 23, 25, and 27 of the smaller blades 15–18 toward the DUT terminal 29 independent of the forward edges 22, 24, 26, and 28. For the one to three millimeter normal range of travel mentioned above, the first and second leaf springs 40 and 41 move only slightly along a short arc compared to their lengths (e.g., 20 to 25 millimeters measured to the screw 42 parallel to the Z axis) and so they may be said to exert a relatively constant force against the blades 11–18 (e.g., the force against the blades varies less than ten percent of its maximum value over the range of travel).

Figure 5:
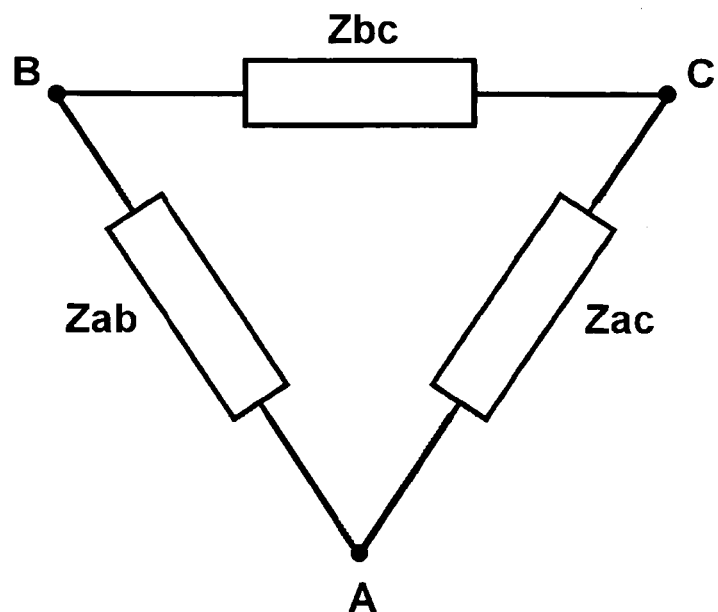
FIG. 5 is a block circuit diagram showing the contact-to-terminal impedances of two adjacent contacts contacting the DUT terminal, along with the contact-to-contact impedance.
Figure 6:
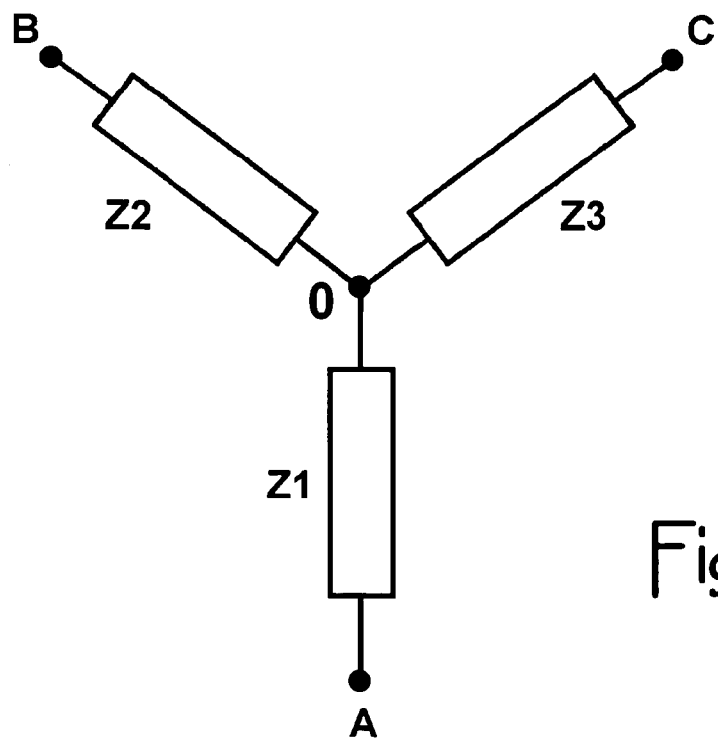
FIG. 6 is a transformed block circuit diagram derived from the block circuit diagram in FIG. 5 that shows the stray effective serial impedance (SSI) between a theoretical measurement definition point and the two adjacent contacts and the DUT terminal.

Well-known circuit theory explains the decreased SSI achieved by the contactor assembly 10. Point A in FIGS. 5 and 6 represents the DUT terminal 29. Point B represents the forward edge 24 of the blade 12 (i.e., a first one of two adjacent contacts), and point C represents the forward edge 28 of the blade 17 (i.e., a second one of two adjacent contacts). Zab in FIG. 5 represents the serial resistance between the forward edge 24 and the DUT terminal 29, while Zac in FIG. 5 represents the serial resistance between the forward edge 28 and the DUT terminal 29. Zbc represents the impedance between the two forward edges 24 and 28 (e.g., impedance between the two adjacent blades 12 and 17).

The stray serial impedance (SSI) is determined by performing an impedance transformation from FIG. 5 to FIG. 6. The SSI (Z1) defined between point 0 (a theoretical measurement definition point) and point A (the surface of the DUT terminal) is calculated from contact impedances Zab and Zac and the impedance Zbc between point B (the first blade 12) and point C (the second blade 17). Zbc can be variable or a constant value between the blades, such as a 10 Ohm resistor. It can have a value anywhere between that of an insulator (very high impedance) or that of a poor conductor with a very low impedance (e.g., unplated steel) that is still and order of magnitude greater than the contact impedance Zab or Zac. The value Z1, for example, is calculated as follows:

$$Z1 = \frac{Zab \times Zac}{Zab + Zac + Zbc} \qquad \text{Equation 1}$$

Impedance values for the reverse transformation from FIG. 6 to FIG. 5 are calculated as follows:

$$Zab = Z1 + Z2 + \frac{Z1 \times Z2}{Z3} \qquad \text{Equation 2}$$

The foregoing considerations show that the stray serial impedance (SSI) for the contactor assembly 10 is significantly less, and measurement verifies that to be true.

Next consider FIGS. 7–11. They show various aspects of a second embodiment of the invention in the form of a four-spring, twelve-blade, contactor assembly 100. The contactor assembly 100 is similar in some respects to the contactor assembly 10 and so only differences are described in further detail. For convenience, reference numerals designating parts of the contactor assembly 100 are increased by one hundred over those designating similar or related parts of the contactor assembly 10.

Similar to the contactor assembly 10, the contactor assembly 100 includes a contact-holding structure for holding a plurality of at least three contacts on the testing system 32 shown in FIG. 4. However, the contact-holding structure is configured differently and it holds twelve blades to further help insure good contact with the DUT terminal 29. The contact-holding structure includes a first section 119a identified in FIGS. 7–10 that assembles together with a second section 119b identified in FIGS. 7, 9, and 10, and a third section 119c identified in FIGS. 7, 8, and 10 using first, second, and third pins 119d, 119e, and 119f identified in FIG. 8. When assembled together, the second and third sections 119b and 119c hold four springs 101,102,103, and 104 between them (FIGS. 7–10) so that the four springs 101–104 bear against the twelve blades 101a–c, 102a–c, 103a–c, and 104a–c. Just the blade 101a is identified in FIGS. 7 and 8, just the blade 103b is identified in FIG. 9, and all twelve blades are identified in FIG. 11. The forward edges 105a–105l are identified in FIGS. 10 and 11. They bear against the DUT terminal 29 in FIG. 4 as the blades pivot about a nonconductive sleeve 107 (FIG. 9) disposed over the pin 119d in order to accommodate variances in the shape of the DUT terminal 29.

The contactor assembly 100 includes insulator members intermediate adjacent ones of the twelve blades and between the outermost blades and the first section 119a of the contact-holding structure. Just one of the insulator members (insulator member 106) is visible in FIG. 9. Of course, insulation can be provided instead by a nonconductive coating on some or all of the blades, just so long as the forward edges 105a–105l of the blades are exposed so they can electrically contact the DUT terminal. The valve of insulation can be anywhere between that of a poor conductor (with a value an order of magnitude greater than the contact impedance) and an insulator presenting very high impedance. In addition to the foregoing, the second and third sections 119b and 119c combine to form a female connector 150 (FIGS. 7–10) for use in electrically connecting the four springs 101–104 (and thereby the twelve blades) to the testing system 32 shown in FIG. 4, while the first section 119a includes protrusions 151 and 152 that serve to properly aligned the contactor assembly 100 when it is mounted on the testing system 32.

Figure 12:
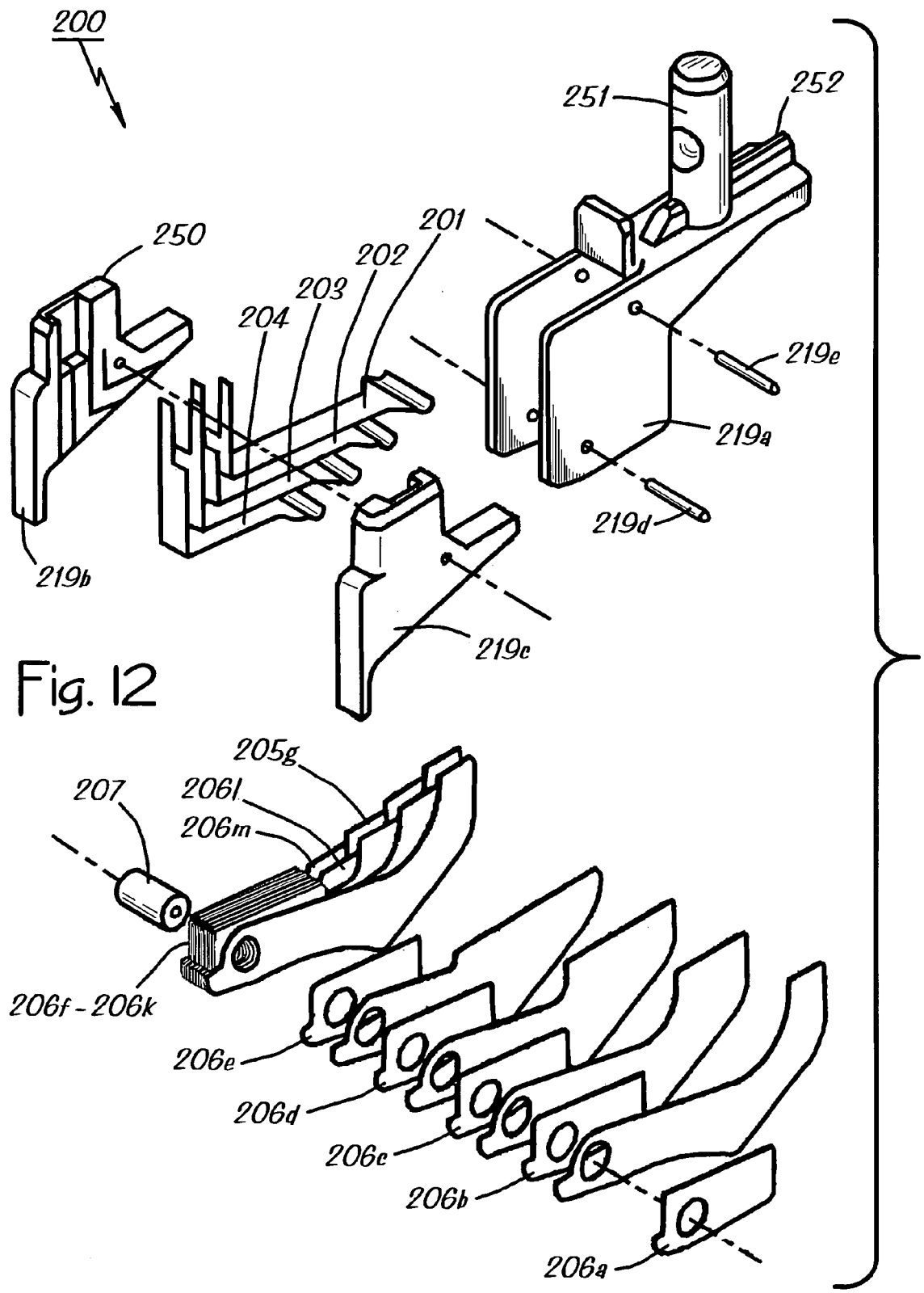
FIG. 12 is an exploded view of a four-spring, twelve-blade, third embodiment having a slightly different contact-holding structure, with the exploded view showing more of the assembly details and exposing more of the insulators intermediate the blades.

Now consider FIG. 12. It shows a third embodiment in the form of a four-spring, twelve-blade, contactor assembly 200. The contactor assembly 200 is similar in structure and function to the contactor assembly 100, having a slightly different contact-holding structure. Also, FIG. 12 helps further illustrate the relationship of parts for the contactor assembly 100 described above. For convenience, reference numerals designating parts of the contactor assembly 200 are increased by one hundred over those designating similar or related parts of the contactor assembly 100.

Similar to the contactor assembly 100, the contactor assembly 200 includes a contact-holding structure for holding a plurality of at least three contacts (twelve blade-type contacts) on the testing system 32 shown in FIG. 4. The contact-holding structure includes first, second, and third sections 219a, 219b and 219c that assemble together with pins 219d and 219e to hold four springs 201, 202, 203, and 204. Each of the four springs bears against various ones of twelve blades, and the blades are insulated by insulator members 206a through 206m. The twelve blades pivot about a nonconductive sleeve 207 that is assembled coaxially over the pin 219d. When assembled, the second and third sections 219b and 219c of the contact-holding structure form a female connector 250 similar to the female connector 150 of the contactor assembly 100. Apart from those similarities, the first section 219a of the contact-holding structure includes differently configured protrusions 251 and 252 that engage mating structure on a testing machine for alignment purposes.

Figure 13:
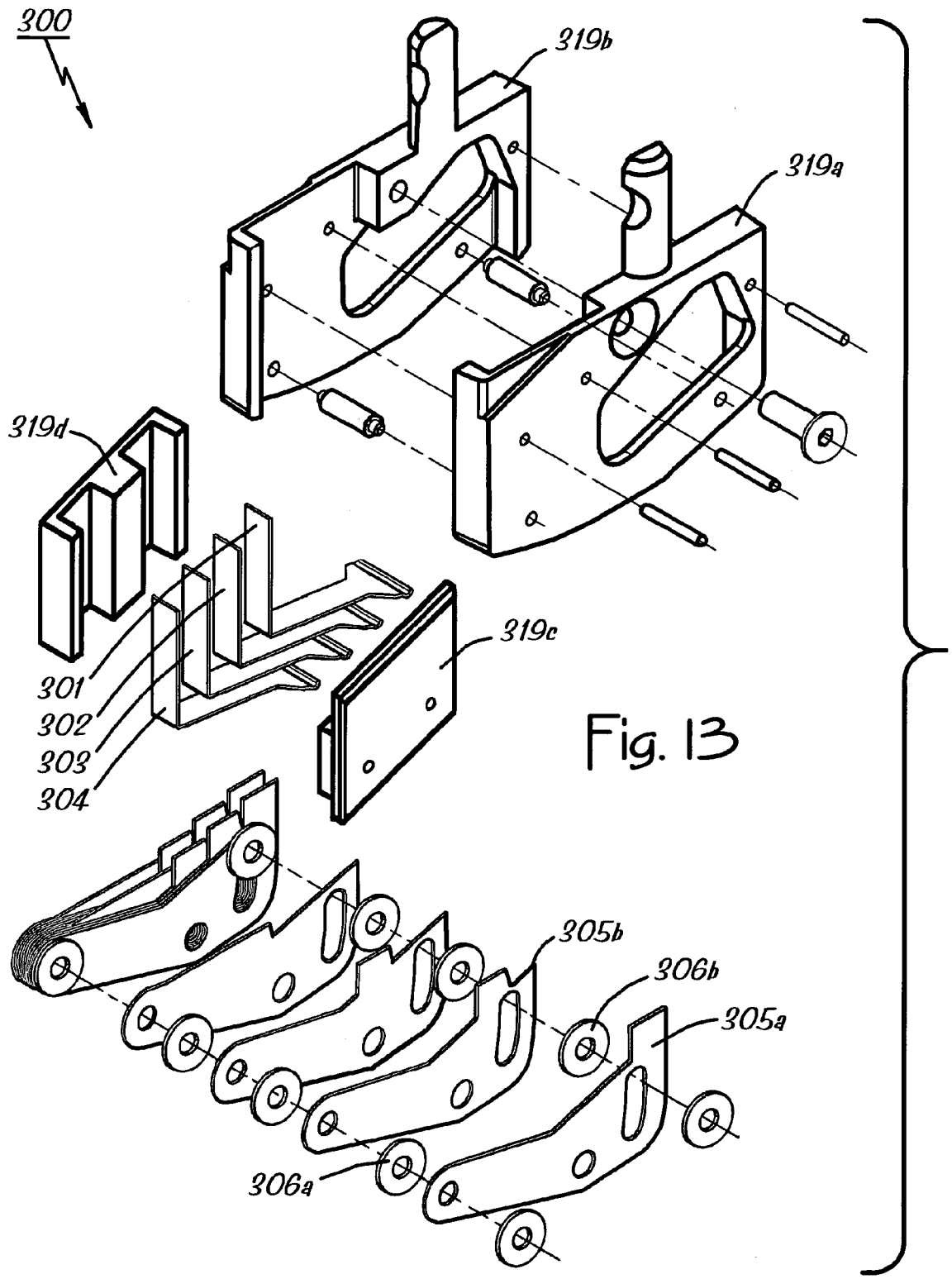
FIG. 13 is an exploded view of a four-spring, twelve-blade, fourth embodiment having different insulators intermediate the blades.

Turning now to FIG. 13, it shows a fourth embodiment in the form of a four-spring, twelve-blade, contactor assembly 300. The contactor is assembly 300 is similar in structure and function to the contactor assembly 200. The primary difference is a different insulator arrangement. For convenience, reference numerals designating parts of the contactor assembly 300 are increased by one hundred over those designating similar or related parts of the contactor assembly 200.

Similar to the contactor assembly 200, the contactor assembly 300 includes a contact-holding structure for holding a plurality of at least three contacts (twelve blade-type contacts) on the testing system 32 shown in FIG. 4. The contact-holding structure is a little different than that of the contactor assembly 200, including first, second, third, fourth sections 319a, 319b, 319c, and 319d that assemble together. The components 319c and 319d of the contact-holding structure hold four springs 301, 302, 303, and 304 in position to bear against and thereby spring bias various ones of twelve blades, just two blades 305 and 306 being identified in FIG. 13.

The blades are insulated by insulator members, of which just two insulators 306a and 306b are identified in FIG. 13. Unlike the insulators of the contactor assembly 200, the insulators of the contactor assembly 300 (including the insulators 306a and 306b) are circularly shaped, washer-like components of a suitable, electrically nonconducting composition. Pairs of the insulators are provided between adjacent blades and between the outermost blades and the components 319a and 319b of the contact-holding structure for the added blade stability thereby achieved, as indicated by the pair of insulators 306a and 306b between the blades 305a and 305b. Thickness of the insulators can be chosen to achieve a desired spacing between blades for specific applications (e.g., contacting multiple terminals on an array component).

FIGS. 14a–14e show details of a fifth embodiment in the form of a roller-type contactor assembly 400. The contactor assembly 400 is similar in many respects to the contactor assembly 300, the primary difference being rollers on the blades that convert a sliding-type contactor (e.g., the contactor assembly 300) to the roller-type contactor assembly 400. For convenience, reference numerals designating parts of the contactor assembly 400 are increased by one hundred over those designating similar or related parts of the contactor assembly 300.

Similar to the contactor assembly 300, the contactor assembly 400 includes a combination of contact-holding structure components 419a, 419b, 419c, and 419d that assemble together to form a contact-holding structure for holding four electrically conductive springs 401, 402, 403, and 404 and four electrically conductive contacts (FIGS. 14a, 14b, and 14c). The four contacts take the form of roller-blade contact assemblies 406a, 406b, 406c, and 406d mounted for a small amount of pivotal movement about a pivotal axis 407 (FIG. 14b). The spring 402 bears against blades 405a and 405c (FIG. 14c) to spring bias the roller-blade assemblies 406a and 406c toward a DUT terminal (e.g., the DUT terminal 29 in FIG. 4), while the spring 403 bears against blades 405b and 405d to spring bias the roller-blade assemblies 405b and 405d. The springs 401 and 404 are unused and can be omitted from the contactor assembly 400 for the roller-blade arrangement illustrated in FIGS. 14a–14e.

The roller-blade contact assemblies 406a–406d are generally similar and so details of just the roller-blade contact assembly 406a are described in further detail with reference to FIGS. 14d and 14e. The roller-blade assembly 406a includes two electrically conductive rollers 408a and 408b (e.g., bronze beryllium) that are mounted on the blade 405a (e.g., also bronze beryllium) with a mounting member 408c and an axle member 408d for rotation about a rotational axis 408e. As the outer circumferences 421 and 422 of the rollers 408a and 408b (FIG. 14e) contact a passing DUT terminal (e.g., the DUT terminal 29 in FIG. 4), the rollers 408a and 408b rotate about the rotational axis 408e so that they roll across the DUT terminal instead of sliding across it. The outer circumferences 421 and 422 are forward edges of the roller-blade assembly 406a, counterparts of the forwarded edges 21–28 identified in FIG. 4 for the contactor assembly 10 and the forward edges 105a–105l identified in FIG. 11 for the contactor assembly 100.

FIGS. 15a–15f show details of a sixth embodiment in the form of a pogo-type contactor assembly 500. The contactor assembly 500 is similar in some respects to the contactor assemblies already described, the primary difference being pogo-pin blades. Reference numerals are in the five hundreds.

The contactor assembly 500 includes a contact-holding structure 519 that holds four electrically conductive pogo-pin blades 505a, 505b, 505c, and 505d. The pogo-pin blades 505a and 505b are connected together with an electrically conductive strap 541 (FIG. 15c) while the pogo-pin blades 505c and 505d are connected together with an electrically conductive strap 542. The pogo-pin blades 505a–505d are held moveably by the contact-support structure 519 so that forwarded edges 521, 522, 523, and 524 identified in FIGS. 15a, 15c, 15d, and 15g are moveable toward and away from a DUT terminal (e.g., the DUT terminal 29 in FIG. 4). Suitable spring biasing components represented by an arrow 551 in FIG. 15c spring biases the pogo-pin blades 505a and 505b with constant force toward the DUT terminal, while other spring biasing components represented by an arrow 552 in FIG. 15c spring biases the pogo-pin blades 505c and 505d toward the DUT terminal. The force varies over the range of travel of the blades less than ten percent of its maximum value. Electrical connection to the pogo-pin blades is made with the spring biasing components.

Thus, MPC technology provides a contactor assembly having at least three independently moveable contacts in side-by-side relationship that are spring biased toward the DUT terminal. Three contacts help insure that at least two of them contact the DUT terminal for lower stray serial impedance (SSI). Sliding contacts in the form of thin side-by-side blades having forward edges disposed toward the DUT terminal further facilitate multiple contacts. Insulation between contacts isolates the contacts from each other to enable Kelvin measurement techniques, including insulated measurement circuits with several contacts at the same potential (e.g., Kelvin and/or guarded circuits).

An intermediate one of the three contacts may be held at a guard potential in order to help balance leakage currents. The number of blades can be increased beyond three so that they can better conform to the shape of the DUT terminal and provide additional electrical contacts. A controlled impedance (low to high value) can be placed between drive and sense contacts so that a test circuit works even if one of the contacts fail. In addition, direct replacement of an existing contactor assembly with a multi-contact contactor assembly constructed according to MPC technology significantly improves performance. Moreover, MPC technology is adaptable to any of various terminal contacting applications, including contacting a street car power line, contacting the terminals on a rechargeable battery, and so forth.

Figure 16:
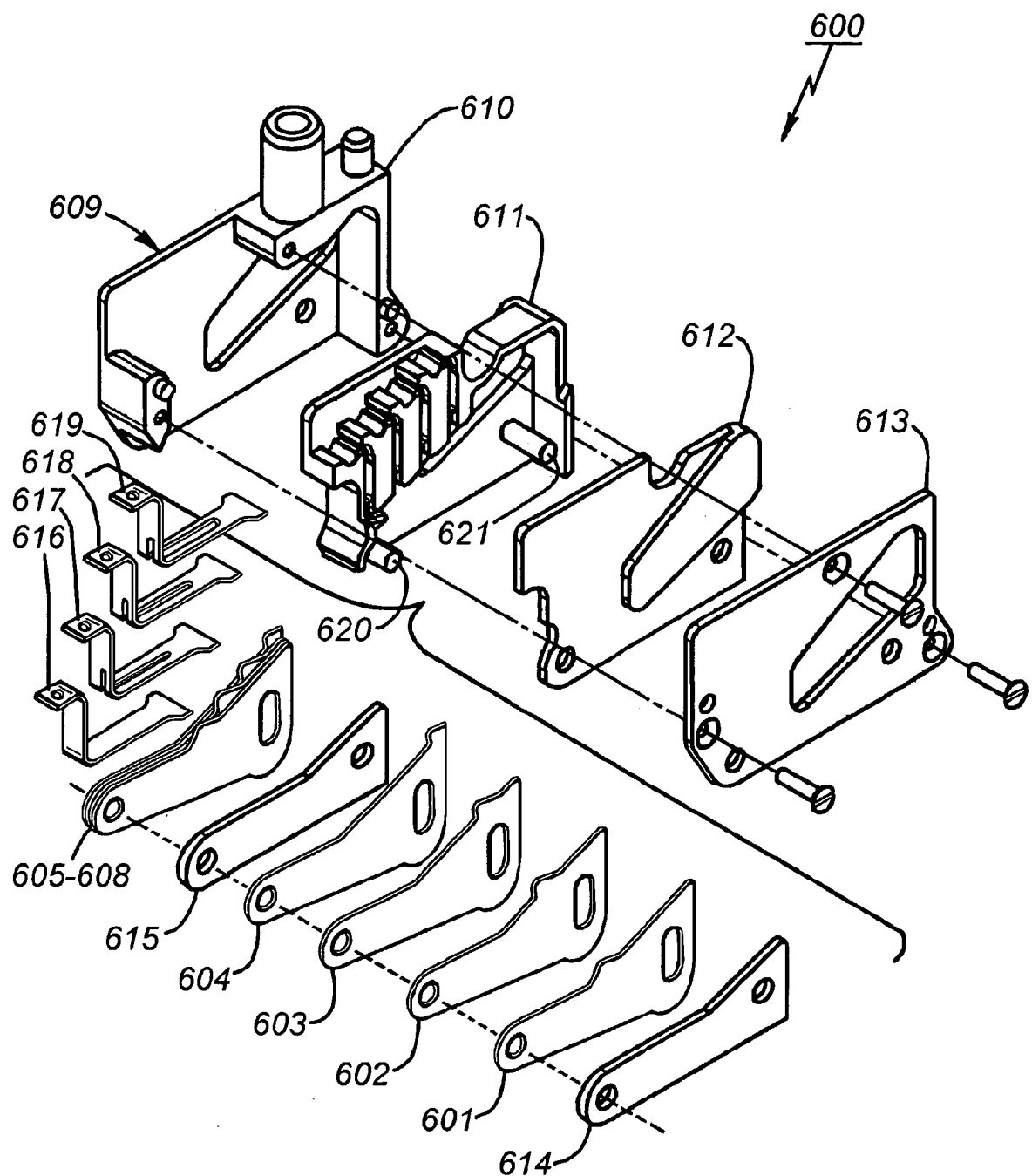
FIG. 16 is an exploded view similar in some respects to FIG. 13 of a four-external-spring, eight integral-spring, constant-force, MPC blade, seventh MPC embodiment.

Blade Construction. Turning now to FIG. 16, it is an exploded view of a contactor assembly 600 that will be referred to in describing the integral-spring aspects of the invention. The contactor assembly 600 is a four-external-spring, eight MPC constant-force integral-spring blade, contactor assembly 600 that is similar in structure and function to the contactor assembly 300 shown in FIG. 13. It includes eight blades 601–608. The blades 601, 602, 603, and 604 are separated in the exploded view of FIG. 16, while the blades 605, 606, 607, and 608 are grouped together as all the blades 601–608 are grouped when they are assembled in a contact-holding structure 609 portion of the contactor assembly 600.

The contact-holding structure 609 includes component parts 610, 611, 612, and 613 that assemble together with the blades 601–608, two spacers 614 and 615, four external springs 616, 617, 618, and 619 ("external" in the sense that they are not integral portions of the blades), a pivot pin 620 (that functions similar to the sleeve 207 in FIG. 12), a stop pin 621 (that limits blade travel), and other supporting components to form the contactor assembly 600. Preferably, the components 611 and 612 are composed of plastic or other electrically nonconductive material. In operation, the external springs 616–619 spring bias the blades 601–608 toward a DUT terminal as the blades pivot about the pivot pin 620 within the limits imposed by the stop-pin 621. The spacers 614 and 615 combine with the blades 601–608 to achieve a desired overall thickness required for a suitable fit between the component parts 611 and 612 of the contact-holding structure 609. The spacers 614 and 615 can also be used to set a desired spacing between blades for specific applications (e.g., contacting multiple terminals on an array component).

Figure 17:
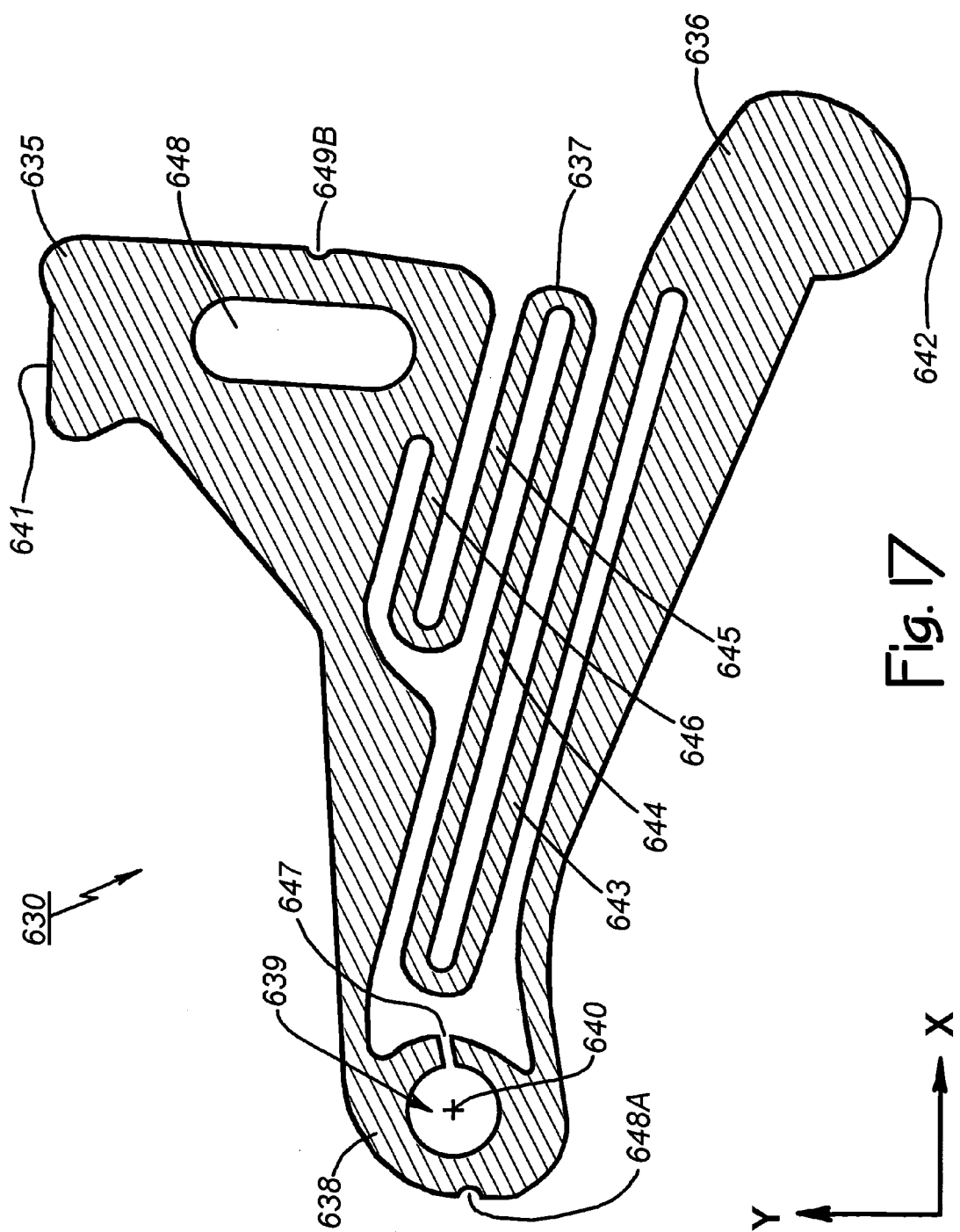
FIG. 17 is a greatly enlarged plan view of a laser-machined contactor blade constructed according to the invention.
Figure 18:
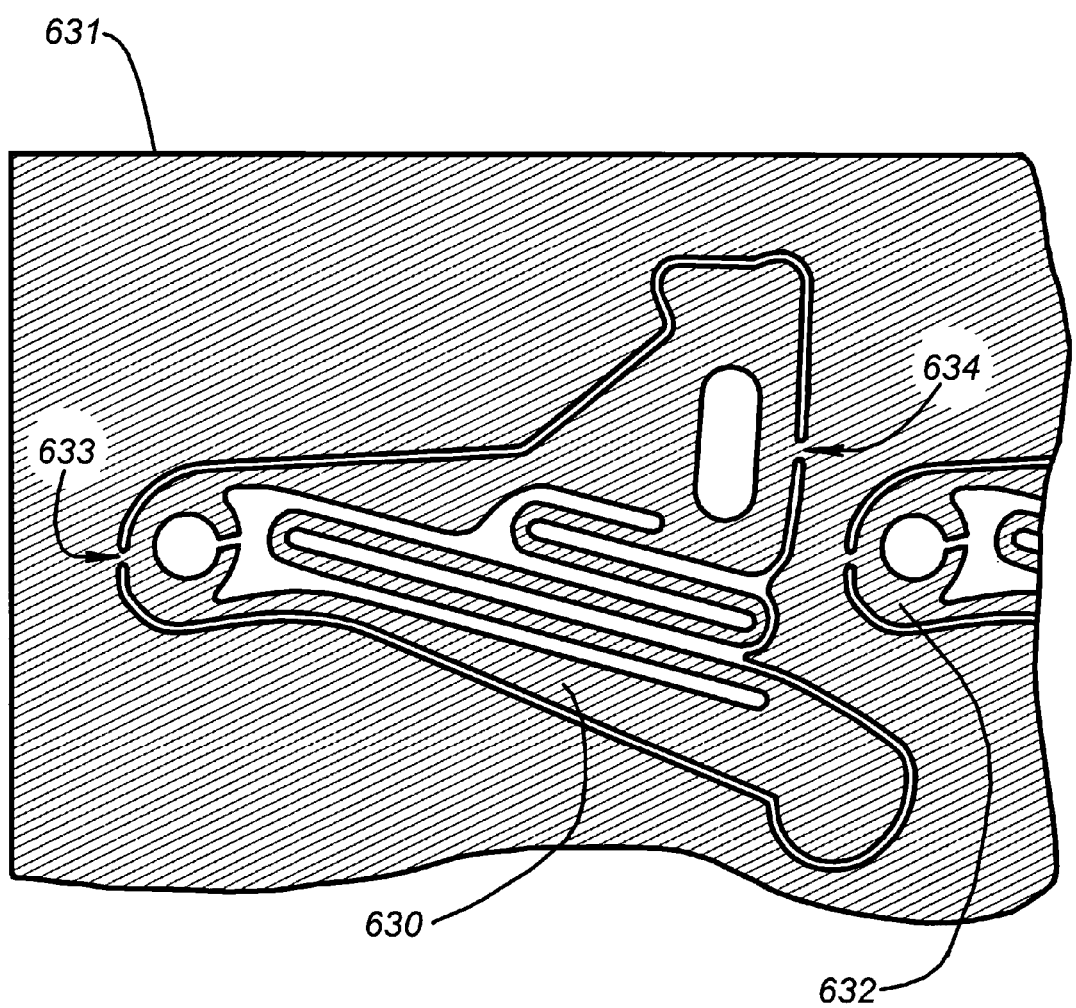
FIG. 18 is a plan view of a portion of a sheet of material that is laser machined to form the contactor blade in FIG. 17, along with an array of similar blades.

Now, considering FIGS. 17 and 18 in conjunction with FIG. 16. FIGS. 17 and 18 show an integral-spring MPC blade 630 constructed according to the integral-spring aspects of the invention by laser machining or chemical etching. The blade 630 mates with the external spring 618 so that the blade 630 is a direct replacement for the blades 603 and 607 of the contactor assembly 600. Other blades (not shown) that are similar to the blade 630 (but configured to mate with the other external springs 616, 617, and 619) serve as direct replacements for the blades 601, 602, 604, 605, 606, and 608. With such direct replacements substituted for the blades 601–608, the contactor assembly 600 becomes an upgraded contactor assembly constructed according to the integral-spring aspects of the invention. It is intended that FIG. 16 serve as an illustration of such an upgraded contactor assembly also.

The blade 630 is laser machined from a sheet 631 (FIG. 18) of electrically conductive material (e.g., a 3-mil to 10-mil thick barium-copper sheet or silver-plated steel alloy of the type from which razor blades are made). The sheet 631 of electrically conductive material is cut to a desired size and shape using laser technology (i.e., laser machined) using known equipment and laser-machining methods to form the blade 630, along with an array of similar blades (e.g., an adjacent blade 632 in FIG. 18) in a regular pattern across the entire sheet 631. The blades 630 and 632, and other blades in the array, are then separated from the rest of the sheet 631 by laser machining to avoid mechanical deformation of the blades. The blade 630 is separated, for example, by removing material at the regions indicated by reference numerals 633 and 634 in FIG. 18. Only a portion of the sheet 631 and a portion of the blade 632 are shown in FIG. 18 for illustrative convenience. The sheet material is shaded to distinguish it from the removed areas, and FIG. 18 is drawn in a somewhat reduced scale compared to FIG. 17.

The blade 630 is fabricated as described above so that it has a desired size, shape, and integral-spring portion. As indicated in FIG. 17, the blade 630 includes a first portion 635 for bearing against the contact-holding structure 609 (either directly or via an external spring). The blade 630 also includes a second portion 642 for bearing against the terminal on a DUT (e.g., the terminal 29 on the DUT 30 in FIG. 4), and a third portion 637 interconnecting the first and second portions 635 and 636. The third portion 637 functions as an integral spring for spring biasing the second portion 636 away from the first portion 635 toward the terminal 29 on the DUT 30.

A hub portion 638 of the blade 630 defines a pivot-pin-receiving opening 639 that facilitates mounting of the blade 630 on the pivot pin 620 of the contact-holding structure 609 in FIG. 16. The pivot-pin-receiving opening 639 receives the pivot pin 620 in a fit that is sufficiently loose to enable the blade 630 to pivot about the pivot pin 620. The first portion 635 of the blade 630 extends radially (relative to a pivotal axis 640) from the hub portion 638 to a spring-contacting surface 641 on the first portion that bears against the contact-holding structure 609 via the external spring 618 on the contactor assembly 600. The second portion 636 of the blade 630 extends radially from the hub portion 638 to a terminal-contacting surface 642 on the second portion 636 that bears against the terminal 29 on the DUT 30 in order to make an electrical contact with the terminal 29.

The first and second portions 635 and 636 are only connected together via the hub portion 638 and the third portion 637 (i.e., the integral-spring portion). The integral-spring third portion 637 includes four segments 643, 644, 645, and 646 that form the illustrated serpentine shape so that the third portion 637 provides the desired spring-biasing effect. In addition, a gap 647 in the hub portion 638 facilitates resilient deformation of the hub portion 638 as the first and second portions 635 and 636 move toward and away from each other. The first portion 635 defines an elongated limit-pin-receiving opening 648 that co-acts with the travel-limiting stop pin 621 on the contactor assembly 600 to limit blade travel (i.e., the degree to which the blade 630 can pivot about the pivot pin 620). Indentation 649A and 649B are formed when material is removed for blade separation purposes at the regions 633 and 634 shown in FIG. 18.

As a further idea of size, the blade 630 measures about 0.7 inches in over all height (in the Y-direction indicated by the X-Y coordinates in FIG. 17) and it measures about 0.95 inches in over all length (in the X-direction). The size and shape of the various portions of the blade 630 are illustrated in FIG. 17 in their actual proportions. Of course, those dimensions may vary significantly according to the precise application. Careful empirical or theoretical determination of the sizes and shapes of the various portions of an integral-spring MPC blade constructed according to the invention results in desired spring characteristics that can be produced consistently in the manner described. The second portion 636 of the blade 630 deflects about 0.5 mm for an applied force of about 6.0 grams. Significantly, all blades fabricated with the same size and shape exhibit essentially the same characteristics. As a result, a contactor assembly constructed according to the invention with integral-spring MPC blades provides light, terminal-conforming, multi point physical contact of a DUT terminal that achieves a superior, multi point electrical contact for parametric testing purposes.

Figure 19:
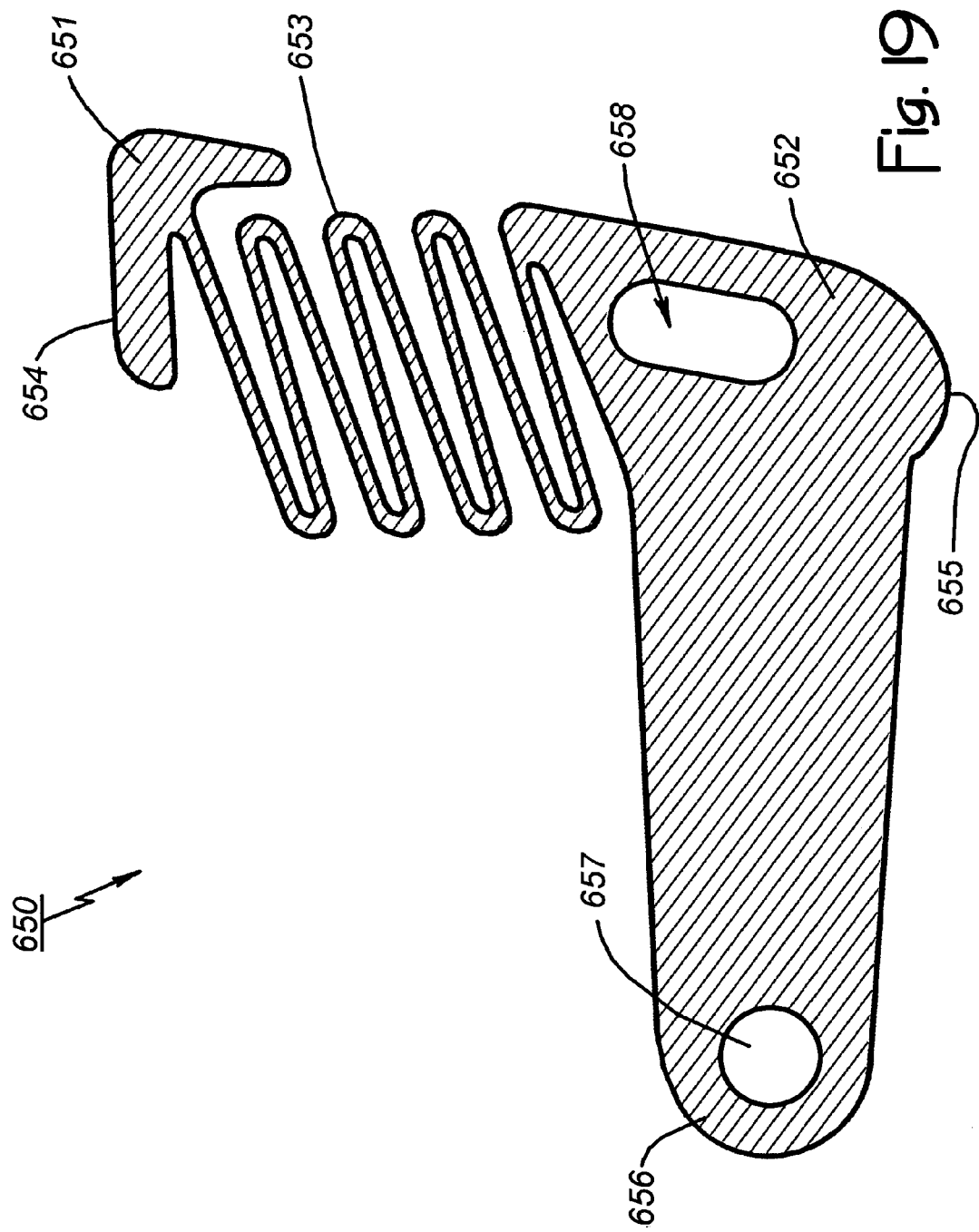
FIG. 19 is a greatly enlarged view of another laser-machined contactor blade.

FIG. 19 shows another embodiment of an integral-spring MPC blade constructed according to the invention. It is identified as a blade 650. It includes first, second, and third portions 651, 652, and 653 that are similar in some respects to the first, second, and third portions 635, 636, and 637 of the blade 630. The first portion 651 includes a surface 654 for bearing against the contact-holding structure 609 (either directly or via an external spring). The second portion 652 includes a surface 655 for bearing against the terminal on a DUT. The third portion 653 interconnects the first and second portions 651 and 652 and functions as an integral spring for spring biasing the second portion 652 away from the first portion 651 toward the terminal on the DUT.

A hub portion 656 defines a pivot-pin receiving opening 657 and the second portion 652 defines a travel-limiting stop-pin-receiving opening 658. The second portion 652 extends radially from the hub portion 656; the first portion 651 does not. The first and second portions 651 and 652 are not connected via the hub portion 656; they are only connected by the integral-spring third portion 653 which includes eight sections in a serpentine pattern that provides the desired spring biasing.

Figure 20A:
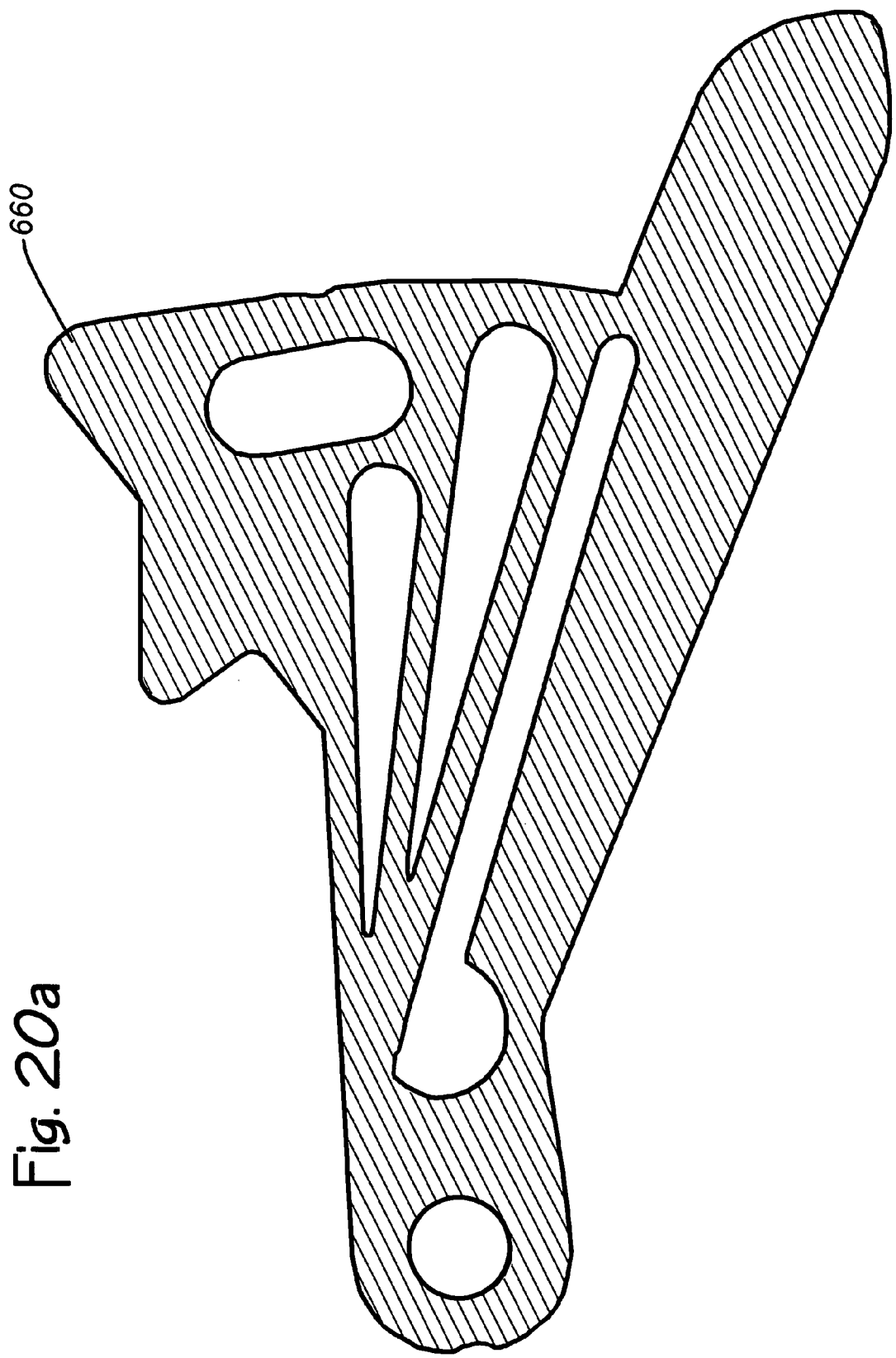
FIGS. 20A, 20B, and 20C illustrate a programmable blade pattern that facilitates selection of desired spring characteristics during fabrication using one basic blade pattern.
Figure 20B:
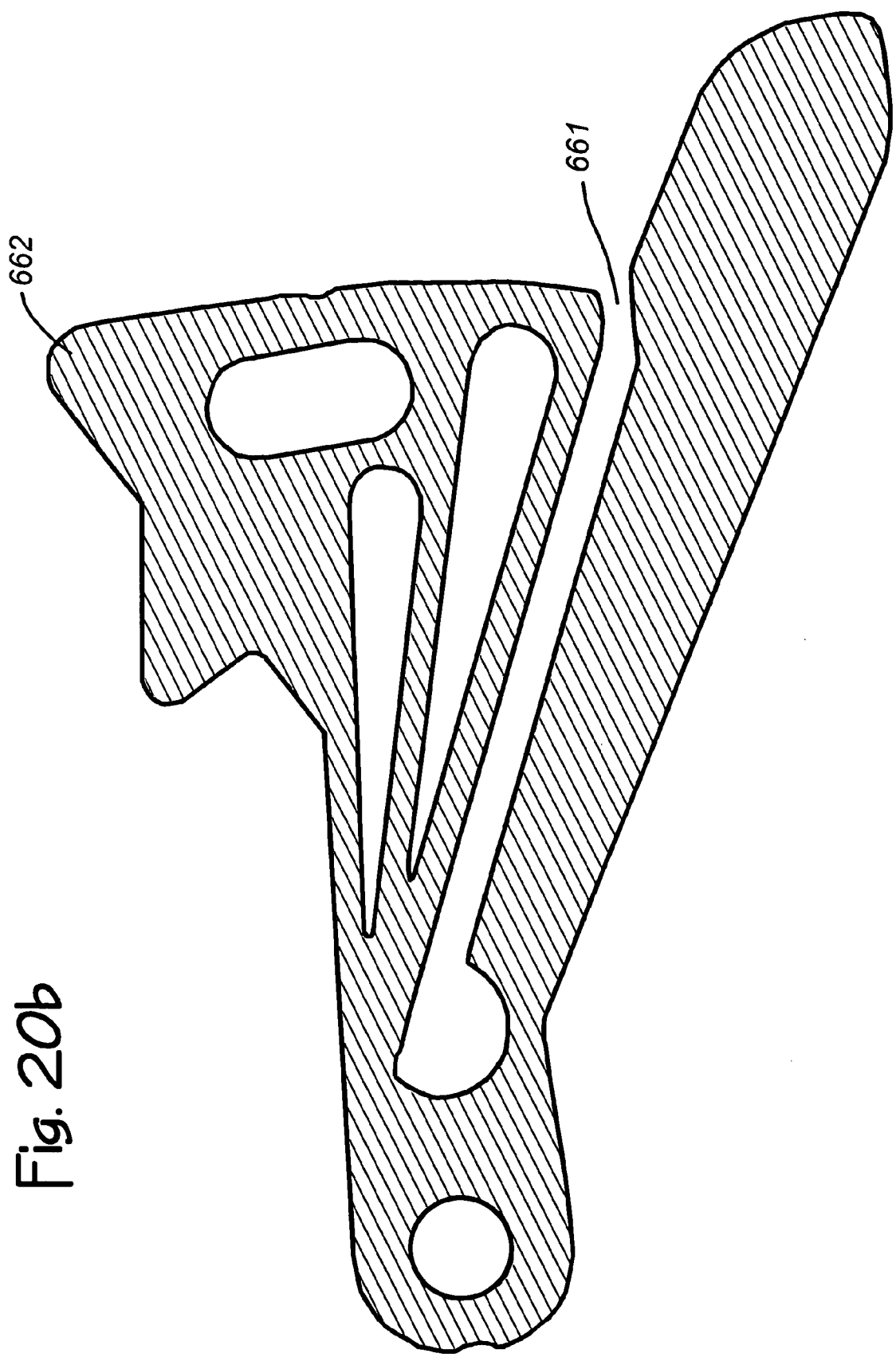
Figure 20C:
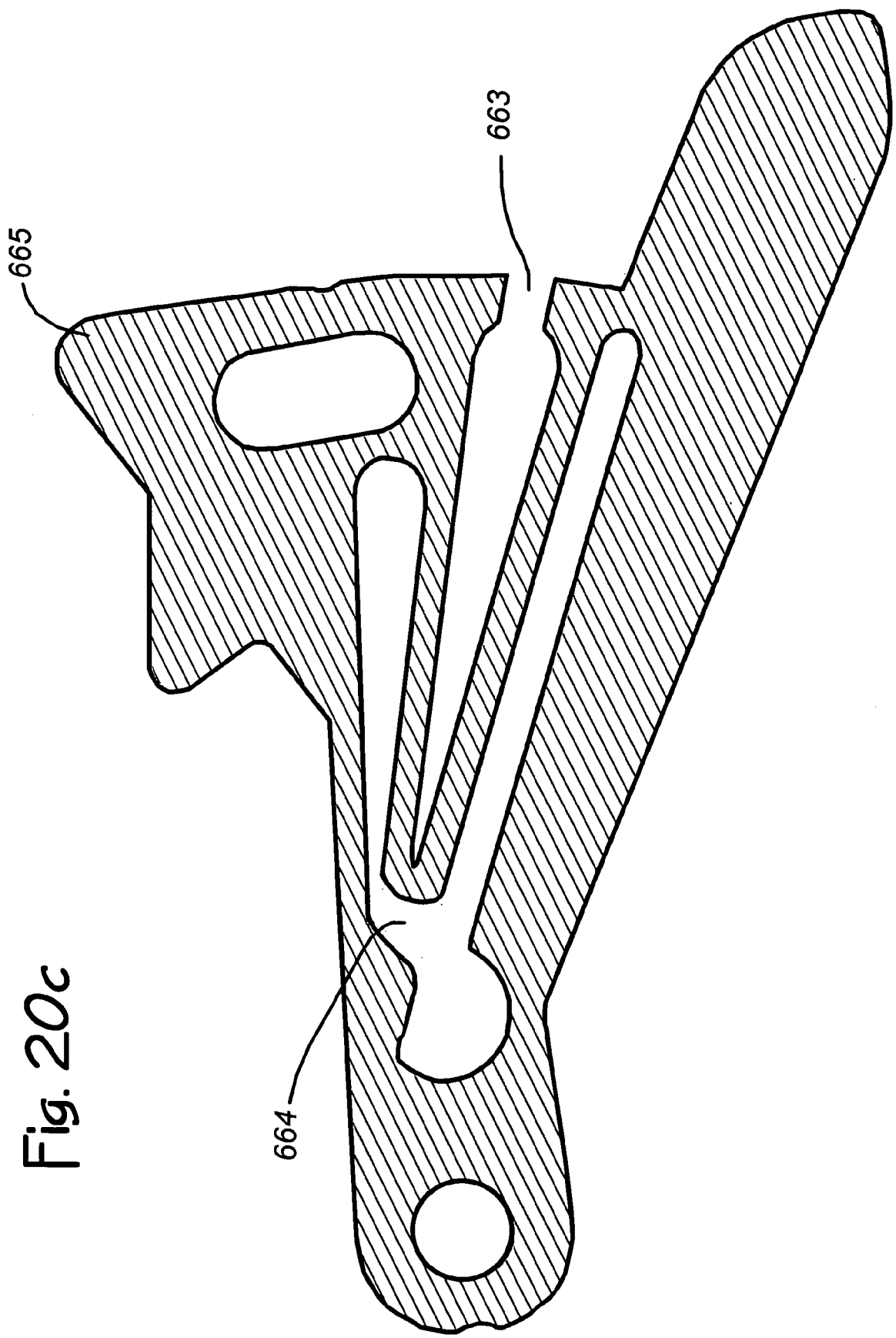

FIGS. 20a, 20b, and 20c show various aspects of a programmable blade pattern 660 for an integral-spring MPC blade constructed according to the invention. Removing material from the basic blade pattern by laser machining at a region 661 (FIG. 20b) results in a first programmed blade pattern 662 with a first spring characteristic. Removing material from the basic blade pattern by laser machining at a region 663 (FIG. 20c) results in a programmed blade pattern 665 with a different second spring characteristic. Thus, a manufacturer can conveniently adapt the programmable blade pattern 660 to use for a selected one or both of the programmed blade patterns 662 and 665.

Recapitulating the methodology employed, the method of this invention provides a method for fabricating contacts (also referred to herein as blades) that are useable on an MPC assembly of a component testing system for electrically contacting a terminal on a DUT as the component testing system moves the DUT past the contactor assembly. The method includes the step of providing a sheet of electrically conductive material. The method proceeds by laser-machining or chemically etching the sheet of electrically conductive material to produce an array of blades such that each blade includes a first portion for bearing against the contact-holding structure, a second portion for bearing against the terminal on the DUT, and a third portion interconnecting the first and second portions as an integral spring having desired spring characteristics for spring biasing the second portion away from the first portion toward the terminal on the DUT. The array of blades is then separated into separate blades.

Thus, the invention significantly improves MPC technology with a constant-force, integral-spring, MPC contact blade. Although exemplary embodiments have been shown and described, one of ordinary skill in the art may make many changes, modifications, and substitutions without necessarily departing from the spirit and scope of the invention. One of ordinary skill in the art can, for example, fabricate a pogo-pin blade of the type discussed herein with reference to FIGS. 15a through 15g so that it includes an integral spring, and the claims are intended to cover such a configuration.

The invention claimed is:

1. A contactor assembly useable on a component testing system for electrically contacting a terminal on a DUT as the component testing system moves the DUT past the contactor assembly, the contactor assembly comprising:

at least three contacts having forward edges for physically and electrically contacting the terminal on the DUT as the component testing system moves the DUT past the contactor assembly, including a first contact having a first forward edge, a second contact having a second forward edge, and a third contact having a third forward edge;

a contact-holding structure mountable on the component testing system for supporting the contacts in side-by-side relationship for independent movement of the first, second, and third forward edges toward and away from the terminal on the DUT as the DUT moves past the contactor assembly; and means for spring biasing the first, second, and third forward edges toward the terminal on the DUT;

wherein the means for spring biasing the first, second, and third forward edges toward the terminal on the DUT includes at least two springs;

wherein a first spring of the at least two springs is arranged to spring bias at least one of the first and third forward edges toward the terminal on the DUT independent of the second forward edge;

wherein a second spring of the at least two springs is arranged to spring bias the second forward edge toward the terminal on the DUT independent of the first and third forward edges; and wherein at least one of the contacts includes an integral spring.

2. A contactor assembly as recited in claim 1, wherein at least one of the contacts is a blade fabricated from a sheet of electrically conductive material to include a first portion for bearing against the contact-holding structure, a second portion for bearing against the terminal on the DUT, and a third portion interconnecting the first and second portions that functions as an integral spring for spring biasing the second portion away from the first portion toward the terminal on the DUT.

3. A contactor assembly as recited in claim 2, wherein the third portion of the blade has a serpentine shape.

4. A contactor assembly as recited in claim 2, wherein:
the blade includes a hub portion that defines a pivot-pin-receiving opening in order to facilitate mounting on a pivot pin component of the contactor assembly;
the first portion of the blade extends radially from the hub portion to a spring-contacting surface on the first portion that bears against the contact-holding structure via a spring on the contactor assembly;
the second portion of the blade extends radially from the hub portion to a terminal-contacting surface on the second portion that bears against the terminal on the DUT in order to make an electrical contact with the terminal on the DUT; and
the first and second portions are only connected together via the hub portion and the third portion.

5. A contactor assembly as recited in claim 4, wherein the hub portion of the blade defines a gap extending to the pivot-pin-receiving opening in order to facilitate hub flexure.

6. A contactor assembly as recited in claim 2, wherein the first portion of the blade defines an elongated limit-pin-receiving opening that co-acts with a travel-limiting pin on the contactor assembly to limit blade travel.

7. A contactor assembly as recited in claim 2, wherein:
the blade includes a hub portion that defines a pivot-pin-receiving opening in order to facilitate mounting on a pivot pin component of the contactor assembly;
the second portion of the blade extends radially from the hub portion to a terminal-contacting surface on the second portion that bears against the terminal on the DUT in order to make an electrical contact with the terminal on the DUT;
the first portion of the blade includes a structure-contacting surface that bears against the contact-holding structure; and
the first and second portions are only connected together via the third portion.

8. A contactor assembly as recited in claim 7, wherein the second portion of the blade defines an elongated limit-pin-receiving opening that co-acts with a travel-limiting pin on the contactor assembly to limit blade travel.

* * * * *